United States Patent
Tamegai

[19]

[11] Patent Number: 5,526,335
[45] Date of Patent: Jun. 11, 1996

[54] INFORMATION REPRODUCING METHOD COMPRISING THE STEP OF PREPARING A DEFECT BIT MAP AND A DEFECT INDEX TABLE

[75] Inventor: Masahiro Tamegai, Koga, Japan

[73] Assignee: Canon Kabushiki Kaisha, Tokyo, Japan

[21] Appl. No.: 200,013

[22] Filed: Feb. 22, 1994

[30] Foreign Application Priority Data

Feb. 19, 1993 [JP] Japan .................................. 5-053168
Jul. 22, 1993 [JP] Japan .................................. 5-201246

[51] Int. Cl.⁶ .................................................. G11B 7/00
[52] U.S. Cl. .......................... 369/58; 369/47; 369/32
[58] Field of Search ................................. 369/48, 58, 54, 369/53, 44.26, 32, 59, 47; 360/72.1, 72.2; 395/499; 235/454, 456

[56] References Cited

U.S. PATENT DOCUMENTS

| | | | |
|---|---|---|---|
| 4,796,113 | 1/1989 | Hayakawa . | |
| 4,827,462 | 5/1989 | Flannagan et al. | 369/32 |
| 4,841,498 | 6/1989 | Sugimura et al. | 369/32 |
| 4,953,122 | 8/1990 | Williams | 369/53 |
| 5,077,720 | 12/1991 | Takagi et al. | 369/59 |
| 5,142,515 | 8/1992 | McFerrin et al. | 369/54 |
| 5,164,577 | 11/1992 | Horie | 369/59 |
| 5,216,655 | 6/1993 | Hearn et al. | 369/58 |
| 5,233,591 | 8/1993 | Nishihara | 369/32 |
| 5,271,018 | 12/1993 | Chan | 369/32 |
| 5,319,627 | 6/1994 | Shinno et al. | 369/58 |
| 5,367,652 | 11/1994 | Golden et al. | 395/499 |

FOREIGN PATENT DOCUMENTS

| | | |
|---|---|---|
| 0440413 | 8/1991 | European Pat. Off. . |
| 0559468 | 9/1993 | European Pat. Off. . |
| 61-243994 | 10/1986 | Japan . |
| 5-250812 | 9/1993 | Japan . |
| WO84/00628 | 2/1984 | WIPO . |

OTHER PUBLICATIONS

Patent Abstracts of Japan, vol. 12, No. 138 (P-695), published Apr. 27, 1988, English Abstract of Japanese Pat. No. 62-259,567.
IBM Technical Disclosure Bulletin, vol. 35, No. 4A, published Sep., 1992.
Patent Abstracts of Japan, vol. 13, No. 309 (P-898), published Jul. 14, 1989, English Abstract of Japanese Pat. No. 1-081,028.

*Primary Examiner*—Nabil Z. Hindi
*Attorney, Agent, or Firm*—Fitzpatrick, Cella, Harper & Scinto

[57] ABSTRACT

In an information reproducing method, directory data for managing file data is recorded on an information recording medium to manage recording reproduction of the file data. There are provided a defect bit map in which defect information indicating if a defect exists or not corresponding to each physical address of the recording medium is recorded on the recording medium, and a defect index table on which the number of defects in a block is recorded every predetermined block of the defect bit map. When a designated logical address is converted into a physical address, searching is sequentially performed on a block on the defect index table where the designated logical address exists and a physical address in the searched block on the defect bit map.

11 Claims, 27 Drawing Sheets

NOTE) VALUES IN BIT MAP AND INDEX TABLE ARE EXPRESSED BY HEX

FIG. 4A PRIOR ART
USER DIRECTORY

| BYTE | |
|---|---|
| 0~3 | HEADER "DIRU" |
| 4, 5 | SYSTEM DIRECTORY NUMBER |
| 6, 7 | USER DIRECTORY NUMBER |
| 8, 9 | START LOGICAL SECTOR ADDRESS |
| 10, 11 | THE NUMBER OF LOGICAL SECTOR MANAGED |
| 12, 13 | START PHYSICAL SECTOR ADDRESS |
| 14, 15 | THE NUMBER OF PHYSICAL SECTOR MANAGED |
| 16, 17 / 18, 19 | DEFECT LIST 1<br>FIRST ADDRESS OF THE SUCCESSIVE DEFECTIVE ADDRESS<br>THE NUMBER OF SUCCESSIVE DEFECTIVE SECTOR |
| 20, 21 / 22, 23 | DEFECT LIST 2<br>FIRST ADDRESS OF THE SUCCESSIVE DEFECTIVE ADDRESS<br>THE NUMBER OF SUCCESSIVE DEFECTIVE SECTOR |
| 24, 25 / 26, 27 | DEFECT LIST 3<br>FIRST ADDRESS OF THE SUCCESSIVE DEFECTIVE ADDRESS<br>THE NUMBER OF SUCCESSIVE DEFECTIVE SECTOR |
| 28~59 | USER DIRECTORY DATA 32 BYTE |

FIG. 4B PRIOR ART
SISTEM DIRECTORY

| BYTE | |
|---|---|
| 0~3 | HEADER "DIRS" |
| 4, 5 | SYSTEM DIRECTORY NUMBER |
| 6, 7 | RESERVE (0) |
| 8, 9 | START LOGICAL SECTOR ADDRESS |
| 10, 11 | THE NUMBER OF LOGICAL SECTOR MANAGED |
| 12, 13 | START PHYSICAL SECTOR ADDRESS |
| 14, 15 | THE NUMBER OF PHYSICAL SECTOR MANAGED |
| 16, 17 / 18, 19 | DEFECT LIST 1<br>FIRST ADDRESS OF THE SUCCESSIVE DEFECTIVE ADDRESS<br>THE NUMBER OF SUCCESSIVE DEFECTIVE SECTOR |
| 20, 21 / 22, 23 | DEFECT LIST 2<br>FIRST ADDRESS OF THE SUCCESSIVE DEFECTIVE ADDRESS<br>THE NUMBER OF SUCCESSIVE DEFECTIVE SECTOR |
| ⋮ | ⋮ |
| 56, 57 / 58, 59 | DEFECT LIST 11<br>FIRST ADDRESS OF THE SUCCESSIVE DEFECTIVE ADDRESS<br>THE NUMBER OF SUCCESSIVE DEFECTIVE SECTOR |

FIG. 7A
PRIOR ART
"DIRU"

| HEADER |
|---|
| SYSTEM DIRECTORY NUMBER 1 |
| USER DIRECTORY NUMBER 1 |
| START LOGICAL SECTOR ADDRESS = 0 |
| THE NUMBER OF LOGICAL SECTOR MANAGED = 7 |
| START PHYSICAL SECTOR ADDRESS = 0 |
| THE NUMBER OF PHYSICAL SECTOR MANAGED = 9 |
| DEFECT LIST 1<br>FIRST ADDRESS OF THE SUCCESSIVE DEFECTIVE ADDRESS = 3<br>THE NUMBER OF SUCCESSIVE DEFECTIVE SECTOR = 2 |
| DEFECT LIST 2<br>FIRST ADDRESS OF THE SUCCESSIVE DEFECTIVE ADDRESS = 0<br>THE NUMBER OF SUCCESSIVE DEFECTIVE SECTOR = 0 |
| DEFECT LIST 3<br>FIRST ADDRESS OF THE SUCCESSIVE DEFECTIVE ADDRESS = 0<br>THE NUMBER OF SUCCESSIVE DEFECTIVE SECTOR = 0 |
| USER DIRECTORY DATA 32 BYTE |

FIG. 7B
PRIOR ART
"DIRU"

| HEADER |
|---|
| SYSTEM DIRECTORY NUMBER 2 |
| USER DIRECTORY NUMBER 2 |
| START LOGICAL SECTOR ADDRESS = 7 |
| THE NUMBER OF LOGICAL SECTOR MANAGED = 3 |
| START PHYSICAL SECTOR ADDRESS = 9 |
| THE NUMBER OF PHYSICAL SECTOR MANAGED = 7 |
| DEFECT LIST 1<br>FIRST ADDRESS OF THE SUCCESSIVE DEFECTIVE ADDRESS = 9<br>THE NUMBER OF SUCCESSIVE DEFECTIVE SECTOR = 1 |
| DEFECT LIST 2<br>FIRST ADDRESS OF THE SUCCESSIVE DEFECTIVE ADDRESS = 11<br>THE NUMBER OF SUCCESSIVE DEFECTIVE SECTOR = 2 |
| DEFECT LIST 3<br>FIRST ADDRESS OF THE SUCCESSIVE DEFECTIVE ADDRESS = 14<br>THE NUMBER OF SUCCESSIVE DEFECTIVE SECTOR = 1 |
| USER DIRECTORY DATA 32 BYTE |

FIG. 7C
PRIOR ART
"DIRS"

| HEADER |
|---|
| SYSTEM DIRECTORY NUMBER 3 |
| RESERVE (0) |
| START LOGICAL SECTOR ADDRESS = 10 |
| THE NUMBER OF LOGICAL SECTOR MANAGED = 1 |
| START PHYSICAL SECTOR ADDRESS = 16 |
| THE NUMBER OF PHYSICAL SECTOR MANAGED = 3 |
| DEFECT LIST 1<br>FIRST ADDRESS OF THE SUCCESSIVE DEFECTIVE ADDRESS = 16<br>THE NUMBER OF SUCCESSIVE DEFECTIVE SECTOR = 2 |
| DEFECT LIST 2<br>FIRST ADDRESS OF THE SUCCESSIVE DEFECTIVE ADDRESS = 0<br>THE NUMBER OF SUCCESSIVE DEFECTIVE SECTOR = 0 |
| ALL OF DEFECT LIST 3 TO DEFECT LIST 11 IS 0 IN THE FOLLOWING |

Cnt: PHYSICAL DEFECTIVE COUNTER
Ptr: PHYSICAL DEFECT LIST NUMBER
La: GIVEN LOGICAL ADDRESS
Bad_A(Ptr): PHYSICAL DEFECT START ADDRESS
Bad_N(Ptr): THE NUMBER OF PHYSICAL DEFECT
Pa: PHYSICAL ADDRESS TO BE FOUND

FIG. 10

| DEFECT LIST NUMBER | 1 | 2 | 3 | 4 | 5 |
|---|---|---|---|---|---|
| FIRST ADDRESS OF THE SUC-CESSIVE DEFECTIVE ADDRESS | 3 | 9 | 11 | 14 | 16 |
| THE NUMBER OF SUCCESSIVE DEFECT | 2 | 1 | 2 | 1 | 2 |

FIG. 12

| | BIT 7 | BIT 6 | BIT 5 | BIT 4 | BIT 3 | BIT 2 | BIT 1 | BIT 0 | |
|---|---|---|---|---|---|---|---|---|---|
| BYTE 0 | 0 | 0 | 0 | 1 | 1 | 0 | 0 | 0 | → $18_{16}$ |
| BYTE 1 | 0 | 1 | 0 | 1 | 1 | 0 | 1 | 0 | → $5A_{16}$ |
| BYTE 2 | 0 | 0 | 0 | 0 | 0 | 0 | 1 | 1 | → $03_{16}$ |

PHYSICAL SECTOR 7~0
PHYSICAL SECTOR 15~8
PHYSICAL SECTOR 23~16

VALUE IN DEFECT BIT MAP

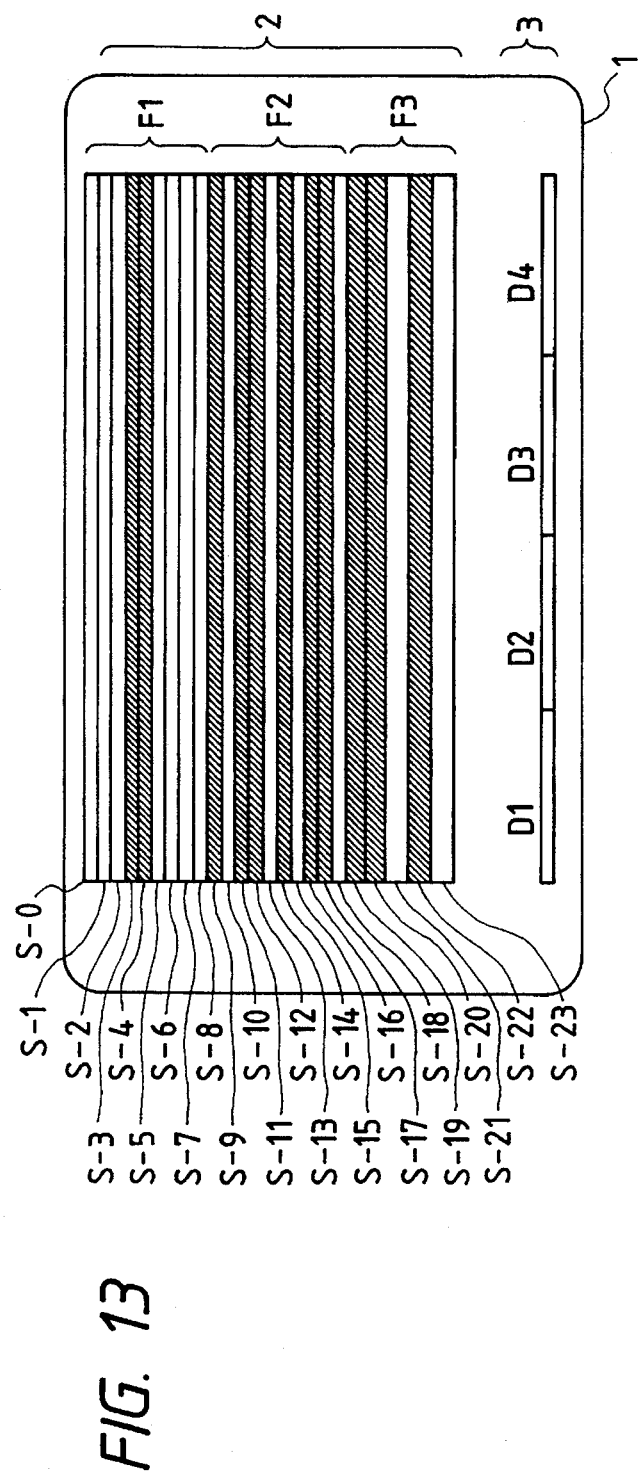

| |
|---|
| "DIRU" |
| SYSTEM DIRECTORY NUMBER 4 |
| USER DIRECTORY NUMBER 3 |
| START LOGICAL SECTOR ADDRESS = 11 |
| THE NUMBER OF LOGICAL SECTOR MANAGED = 2 |
| START PHYSICAL SECTOR ADDRESS = 19 |
| THE NUMBER OF PHYSICAL SECTOR MANAGED = 5 |
| DEFECT LIST 1<br>    FIRST ADDRESS OF THE SUCCESSIVE<br>    DEFECTIVE ADDRESS = 19<br>    THE NUMBER OF SUCCESSIVE<br>    DEFECTIVE SECTOR = 2 |
| DEFECT LIST 2<br>    FIRST ADDRESS OF THE SUCCESSIVE<br>    DEFECTIVE ADDRESS = 22<br>    THE NUMBER OF SUCCESSIVE<br>    DEFECTIVE SECTOR = 1 |
| DEFECT LIST 3<br>    FIRST ADDRESS OF THE SUCCESSIVE<br>    DEFECTIVE ADDRESS = 0<br>    THE NUMBER OF SUCCESSIVE<br>    DEFECTIVE SECTOR = 0 |
| USER DIRECTORY<br>DATA 32 BYTE |

| HEADER "DIRU" |
|---|
| SYSTEM DIRECTORY NUMBER 1 |
| USER DIRECTORY NUMBER 1 |
| START LOGICAL SECTOR ADDRESS = 0 |
| THE NUMBER OF LOGICAL SECTOR MANAGED = 7 |
| START PHYSICAL SECTOR ADDRESS = 0 |
| THE NUMBER OF PHYGICAL SECTOR MANAGED = 9 |
| DEFECT LIST 1<br>  FIRST ADDRESS OF THE SUCCESSIVE<br>  DEFECTIVE ADDRESS = 3<br>  THE NUMBER OF SUCCESSIVE<br>  DEFECTIVE SECTOR = 2 |
| DEFECT LIST 2<br>  FIRST ADDRESS OF THE SUCCESSIVE<br>  DEFECTIVE ADDRESS = 0<br>  THE NUMBER OF SUCCESSIVE<br>  DEFECTIVE SECTOR = 0 |
| DEFECT LIST 3<br>  FIRST ADDRESS OF THE SUCCESSIVE<br>  DEFECTIVE ADDRESS = 0<br>  THE NUMBER OF SUCCESSIVE<br>  DEFECTIVE SECTOR = 0 |
| USER DIRECTORY<br>DATA 32 BYTE |

| HEADER "DIRU" |
|---|
| SYSTEM DIRECTORY NUMBER 2 |
| USER DIRECTORY NUMBER 2 |
| START LOGICAL SECTOR ADDRESS = 7 |
| THE NUMBER OF LOGICAL SECTOR MANAGED = 3 |
| START PHYSICAL SECTOR ADDRESS = 9 |
| THE NUMBER OF PHYGICAL SECTOR MANAGED = 7 |
| DEFECT LIST 1<br>  FIRST ADDRESS OF THE SUCCESSIVE<br>  DEFECTIVE ADDRESS = 9<br>  THE NUMBER OF SUCCESSIVE<br>  DEFECTIVE SECTOR = 1 |
| DEFECT LIST 2<br>  FIRST ADDRESS OF THE SUCCESSIVE<br>  DEFECTIVE ADDRESS = 11<br>  THE NUMBER OF SUCCESSIVE<br>  DEFECTIVE SECTOR = 2 |
| DEFECT LIST 3.<br>  FIRST ADDRESS OF THE SUCCESSIVE<br>  DEFECTIVE ADDRESS = 14<br>  THE NUMBER OF SUCCESSIVE<br>  DEFECTIVE SECTOR = 1 |
| USER DIRECTORY<br>DATA 32 BYTE |

| |
|---|
| HEADER "DIRS" |
| SYSTEM DIRECTORY NUMBER 3 |
| RESERVATION (0) |
| START LOGICAL SECTOR ADDRESS = 10 |
| THE NUMBER OF LOGICAL SECTOR MANEGED = 1 |
| START PHYSICAL SECTOR ADDRESS = 16 |
| THE NUMBER OF PHYGICAL SECTOR MANEGED = 3 |
| DEFECT LIST 1<br>　　FIRST ADDRESS OF THE SUCCESSIVE<br>　　DEFECTIVE ADDRESS = 16<br>　　THE NUMBER OF SUCCESSIVE<br>　　DEFECTIVE SECTOR = 2 |
| DEFECT LIST 2<br>　　FIRST ADDRESS OF THE SUCCESSIVE<br>　　DEFECTIVE ADDRESS = 0<br>　　THE NUMBER OF SUCCESSIVE<br>　　DEFECTIVE SECTOR = 0 |
| ALL OF DEFECT LIST 3 TO DEFECT LIST 11 IS 0 IN THE FOLLOWING |

| |
|---|
| HEADER "DIRU" |
| SYSTEM DIRECTORY NUMBER 4 |
| USER DIRECTORY NUMBER 3 |
| START LOGICAL SECTOR ADDRESS = 11 |
| THE NUMBER OF LOGICAL SECTOR MANEGED = 2 |
| START PHYSICAL SECTOR ADDRESS = 19 |
| THE NUMBER OF PHYGICAL SECTOR MANEGED = 4 |
| DEFECT LIST 1<br>　　FIRST ADDRESS OF THE SUCCESSIVE<br>　　DEFECTIVE ADDRESS = 19<br>　　THE NUMBER OF SUCCESSIVE<br>　　DEFECTIVE SECTOR = 1 |
| DEFECT LIST 2<br>　　FIRST ADDRESS OF THE SUCCESSIVE<br>　　DEFECTIVE ADDRESS = 21<br>　　THE NUMBER OF SUCCESSIVE<br>　　DEFECTIVE SECTOR = 1 |
| DEFECT LIST 3<br>　　FIRST ADDRESS OF THE SUCCESSIVE<br>　　DEFECTIVE ADDRESS = 0<br>　　THE NUMBER OF SUCCESSIVE<br>　　DEFECTIVE SECTOR = 0 |
| USER DIRECTORY<br>DATA 32 BYTE |

| |
|---|
| HEADER "DIRU" |
| SYSTEM DIRECTORY NUMBER 5 |
| USER DIRECTORY NUMBER 4 |
| START LOGICAL SECTOR ADDRESS = 13 |
| THE NUMBER OF LOGICAL SECTOR MANAGED = 1 |
| START PHYSICAL SECTOR ADDRESS = 23 |
| THE NUMBER OF PHYGICAL SECTOR MANAGED = 2 |
| DEFECT LIST 1<br>    FIRST ADDRESS OF THE SUCCESSIVE<br>    DEFECTIVE ADDRESS = 23<br>    THE NUMBER OF SUCCESSIVE<br>    DEFECTIVE SECTOR = 1 |
| DEFECT LIST 2<br>    FIRST ADDRESS OF THE SUCCESSIVE<br>    DEFECTIVE ADDRESS = 0<br>    THE NUMBER OF SUCCESSIVE<br>    DEFECTIVE SECTOR = 0 |
| DEFECT LIST 3<br>    FIRST ADDRESS OF THE SUCCESSIVE<br>    DEFECTIVE ADDRESS = 0<br>    THE NUMBER OF SUCCESSIVE<br>    DEFECTIVE SECTOR = 0 |
| USER DIRECTORY<br>DATA 32 BYTE |

FIG. 24A

THE NUMBER OF SPREADED PHYSICAL SECTORS  9
THE NUMBER OF MANAGEMENT INFORMATION RECORDED PHYSICAL SECTOR  9
THE NUMBER OF SPREADED LOGICAL SECTORS  7
THE NUMBER OF MANAGEMENT INFORMATION RECORDED LOGICAL SECTOR  7

PHYSICAL DEFECT BIT MAP

| 18 | 00 | 00 | 00 | 00 | 00 | 00 | 00 | 00 | 00 | 00 | 00 | 00 | 00 | 00 | 00 |
|----|----|----|----|----|----|----|----|----|----|----|----|----|----|----|----|
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |

PHYSICAL DEFECT INDEX TABLE

| IDX(i) |
|--------|
| 02 |
| 00 |
| 00 |
| 00 |

NOTE) VALUES IN BIT MAP AND INDEX TABLE ARE EXPRESSED BY HEX

FIG. 24B

|  | | BIT 7 | BIT 6 | BIT 5 | BIT 4 | BIT 3 | BIT 2 | BIT 1 | BIT 0 | |
|---|---|---|---|---|---|---|---|---|---|---|
| PHYSICAL SECTOR 7~0 | BYTE 0 | 0 | 0 | 0 | 1 | 1 | 0 | 0 | 0 | ↑ $18_{16}$ |
| PHYSICAL SECTOR 15~8 | BYTE 1 | 0 | 0 | 0 | 0 | 0 | 0 | 0 | 0 | ↑ $00_{16}$ |
| PHYSICAL SECTOR 23~16 | BYTE 2 | 0 | 0 | 0 | 0 | 0 | 0 | 0 | 0 | ↑ $00_{16}$ |
| PHYSICAL SECTOR 31~24 | BYTE 3 | 0 | 0 | 0 | 0 | 0 | 0 | 0 | 0 | ↑ $00_{16}$ |

VALUE IN PHYSICAL DEFECT BIT MAP

FIG. 25A

| | | | | | | | | | | | | | | | |
|---|---|---|---|---|---|---|---|---|---|---|---|---|---|---|---|
| \multicolumn{16}{|c|}{LOGICAL DEFECT BIT MAP} |
| 80 | 1F | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |

NOTE) VALUES IN BIT MAP ARE EXPRESSED BY HEX

FIG. 25B

| | BIT 7 | BIT 6 | BIT 5 | BIT 4 | BIT 3 | BIT 2 | BIT 1 | BIT 0 | |
|---|---|---|---|---|---|---|---|---|---|
| LOGICAL SECTOR 7~0 | BYTE 0 | 1 | 0 | 0 | 0 | 0 | 0 | 0 | 0 | → $80_{16}$ |
| LOGICAL SECTOR 15~8 | BYTE 1 | 0 | 0 | 0 | 1 | 1 | 1 | 1 | 1 | → $1F_{16}$ |
| LOGICAL SECTOR 23~16 | BYTE 2 | 0 | 0 | 0 | 0 | 0 | 0 | 0 | 0 | → $00_{16}$ |
| LOGICAL SECTOR 31~24 | BYTE 3 | 0 | 0 | 0 | 0 | 0 | 0 | 0 | 0 | → $00_{16}$ |

VALUE IN LOGICAL DEFECT BIT MAP

FIG. 26A

| THE NUMBER OF SPREADED PHYSICAL SECTORS | 25 |
| --- | --- |
| THE NUMBER OF MANAGEMENT INFORMATION RECORDED PHYSICAL SECTOR | 25 |
| THE NUMBER OF SPREADED LOGICAL SECTORS | 14 |
| THE NUMBER OF MANAGEMENT INFORMATION RECORDED LOGICAL SECTOR | 14 |

PHYSICAL DEFECT BIT MAP

| 18 | FE | 81 | 00 | 00 | 00 | 00 | 00 | 00 | 00 | 00 | 00 | 00 | 00 | 00 | 00 |
| --- | --- | --- | --- | --- | --- | --- | --- | --- | --- | --- | --- | --- | --- | --- | --- |
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |

↑ ↑ ↑       ↑

PHYSICAL DEFECT INDEX TABLE

| IDX(i) |
| --- |
| 0B |
| 00 |
| 00 |
| ⋮ |
| 00 |

NOTE) VALUES IN BIT MAP AND INDEX TABLE ARE EXPRESSED BY HEX

FIG. 26B

| | BIT 7 | BIT 6 | BIT 5 | BIT 4 | BIT 3 | BIT 2 | BIT 1 | BIT 0 | |
| --- | --- | --- | --- | --- | --- | --- | --- | --- | --- |
| PHYSICAL SECTOR 7~0 | BYTE 0 | 0 | 0 | 0 | 1 | 1 | 0 | 0 | 0 | → $18_{16}$ |
| PHYSICAL SECTOR 15~8 | BYTE 1 | 1 | 1 | 1 | 1 | 1 | 1 | 1 | 0 | → $FE_{16}$ |
| PHYSICAL SECTOR 23~16 | BYTE 2 | 1 | 0 | 0 | 0 | 0 | 0 | 0 | 1 | → $81_{16}$ |
| PHYSICAL SECTOR 31~24 | BYTE 3 | 0 | 0 | 0 | 0 | 0 | 0 | 0 | 0 | → $00_{16}$ |

VALUE IN PHYSICAL DEFECT BIT MAP

FIG. 28A

| | | | | | | | | | | | | | | | |
|---|---|---|---|---|---|---|---|---|---|---|---|---|---|---|---|
| THE NUMBER OF SPREADED PHYSICAL SECTORS | | | | | | | | | | | | | | | 25 |
| THE NUMBER OF MANAGEMENT INFORMATION RECORDED PHYSICAL SECTOR | | | | | | | | | | | | | | | 25 |
| THE NUMBER OF SPREADED LOGICAL SECTORS | | | | | | | | | | | | | | | 14 |
| THE NUMBER OF MANAGEMENT INFORMATION RECORDED LOGICAL SECTOR | | | | | | | | | | | | | | | 14 |

PHYSICAL DEFECT BIT MAP

| 18 | 1E | 9B | 00 | 00 | 00 | 00 | 00 | 00 | 00 | 00 | 00 | 00 | 00 | 00 | 00 |
|---|---|---|---|---|---|---|---|---|---|---|---|---|---|---|---|
| 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 |

↑ ↑ ↑ ↑

| IDX(i) | PHYSICAL DEFECT INDEX TABLE |
|---|---|
| 0B | |
| 00 | |
| 00 | |
| 00 | |

NOTE) VALUES IN BIT MAP AND INDEX TABLE ARE EXPRESSED BY HEX

FIG. 28B

| | BIT 7 | BIT 6 | BIT 5 | BIT 4 | BIT 3 | BIT 2 | BIT 1 | BIT 0 | |
|---|---|---|---|---|---|---|---|---|---|
| PHYSICAL SECTOR 7~0 | BYTE 0 | 0 | 0 | 0 | 1 | 1 | 0 | 0 | 0 | → $18_{16}$ |
| PHYSICAL SECTOR 15~8 | BYTE 1 | 0 | 0 | 0 | 1 | 1 | 1 | 1 | 0 | → $1E_{16}$ |
| PHYSICAL SECTOR 23~16 | BYTE 2 | 1 | 0 | 0 | 1 | 1 | 0 | 1 | 1 | → $9B_{16}$ |
| PHYSICAL SECTOR 31~24 | BYTE 3 | 0 | 0 | 0 | 0 | 0 | 0 | 0 | 0 | → $00_{16}$ |

VALUE IN PHYSICAL DEFECT BIT MAP

FIG. 29A

LOGICAL DEFECT BIT MAP

| 80 | 1B | 00 | 00 | 00 | 00 | 00 | 00 | 00 | 00 | 00 | 00 | 00 | 00 | 00 | 00 | 00 |
|----|----|----|----|----|----|----|----|----|----|----|----|----|----|----|----|----|
| 00 | 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 | 00 |
| 00 | 00 | 00 | 00 | 00 | 00 | 00 | 00 | 00 | 00 | 00 | 00 | 00 | 00 | 00 | 00 | 00 |

NOTE) VALUES IN BIT MAP ARE EXPRESSED BY HEX

FIG. 29B

| | BIT 7 | BIT 6 | BIT 5 | BIT 4 | BIT 3 | BIT 2 | BIT 1 | BIT 0 | VALUE IN LOGICAL DEFECT BIT MAP |
|---|---|---|---|---|---|---|---|---|---|
| BYTE 0 | 1 | 0 | 0 | 0 | 0 | 0 | 0 | 0 | ↑ $80_{16}$ |
| BYTE 1 | 0 | 0 | 0 | 1 | 1 | 0 | 1 | 1 | ↑ $1B_{16}$ |
| BYTE 2 | 0 | 0 | 0 | 0 | 0 | 0 | 0 | 0 | ↑ $00_{16}$ |
| BYTE 3 | 0 | 0 | 0 | 0 | 0 | 0 | 0 | 0 | ↑ $00_{16}$ |

LOGICAL SECTOR 7~0
LOGICAL SECTOR 15~8
LOGICAL SECTOR 23~16
LOGICAL SECTOR 31~24

INFORMATION REPRODUCING METHOD COMPRISING THE STEP OF PREPARING A DEFECT BIT MAP AND A DEFECT INDEX TABLE

BACKGROUND OF THE INVENTION

The present invention relates to an information reproducing method of reproducing information recorded on a recording medium such as an optical card.

Conventionally, as a write once information recording medium, an optical disk or card for optically recording information is known. When data is recorded/reproduced on/from such a recording medium, the data is generally managed for each file. For management of this file data, auxiliary data, i.e., a so-called directory is used. Normally, as directory information, file information such as a file name, the file length, a start track and the like is recorded in part of the recording medium. If a defect in part of the recording medium forms an inaccessible region, an alternation process is performed as relief to record the same information on a region (to be referred to as an alternative region hereinafter) in place of the defect region. Such an information recording method is proposed in, for example, Japanese Laid-Open Patent Application No. 61-243994, in which defect information is recorded with directory information.

However, in the above method, if a large number of tracks with recording errors exist in one file, all error track numbers cannot always be recorded in one directory which impedes the management of the file data.

The present inventor has previously filed an information recording method in Japanese Patent Application Laid-Open No. 5-240812 which solves the above problem. This method will be described below. FIG. 1 is a block diagram showing the arrangement of an information recording/reproducing apparatus used for the above information recording method. Referring to FIG. 1, a recording/reproducing apparatus 31 (to be referred to as a drive hereinafter) records/reproduces information on/from a write once optical card 1 serving as an information recording medium. The drive 31 is connected to a host computer 32 serving as a host controller, and records/reproduces information on the basis of an instruction from the host computer 32. A motor 37 loads the optical card 1 into the drive 31 by a conveying mechanism (not shown), causes the card 1 to move back and forth in an R direction by a predetermined drive, and removes the card 1 from the apparatus. A light beam radiating optical system 38 includes a light source and scans a light beam spot on the optical card 1 in recording/reproducing information. A photodetector 39 receives the light of the light beam spot reflected by the optical card 1.

An AF actuator 40 drives part of the light beam radiating optical system 38 to move the focusing position of the light beam spot on the optical card 1 in a Z direction, i.e., in a direction perpendicular to the surface of the optical card 1, thereby performing autofocusing (AF). An AT actuator 41 drives part of the light beam radiating optical system 38 to move the light beam spot on the optical card 1 in a Y direction. i.e., in a direction perpendicular to both the R and Z directions, thereby performing autotracking (AT). The light beam radiating optical system 38, the photodetector 39, the AF actuator 40, and the At actuator 41 intergally constitute an optical head 50. A driving motor 36 moves the optical head 50 in the Y direction to cause the light beam spot to access to a desired track on the optical card 1.

An MPU 33 incorporating a ROM and a RAM controls the card driving motor 37 and the head driving motor 36, and performs transmission and control of data under the control of the host computer 32. An AT/AF control circuit 34 receives a signal from the photodetector 39 to drive the AF actuator 40 and the AT actuator 41, thereby controlling focusing and tracking. In this case, the AT/AF control circuit 34 receives the output from the photodetector 39 to control the AF actuator 40 and the AT actuator 41, thereby controlling AF AT. The output from the photodetector is also supplied to a modulation-demodulation circuit 35. The modulation-demodulation circuit 35 performs demodulation of the read information and sends modulated signal to the MPU 33. The modulation-demodulation circuit 35 modulates the information signal sent from the MPU 33, drives the light beam radiating optical system 38 in accordance with the modulated signal to record the information, and at the same time, demodulates the data on the basis of a signal from the photodetector 39. The host computer 32 transmits/receives data to/from the drive 31, and instructs recording/reproducing of information for each data track of the optical card 1. The optical card 1 generally has an inherently high error rate. Therefore, when information with high reliability is required, an error correcting means is necessary.

The above conventional information recording method will be described below. FIG. 2 is a block diagram showing the recording surface of an optical card used for the above method. An optical card 1 has a data region 2 and a directory region 3. Sectors S-1 to S-18 include sectors verified as error sectors upon recording as represented by hatched portions in FIG. 2. Files F1 and F2 comprise a plurality of sectors, and the directory region 3 has directories D1 to D3. Addresses representing sector positions in the data region divided into a plurality of sectors are conveniently called physical addresses. The physical addresses are sequentially counted from a start address. In FIG. 2, the sectors S-1, S-2, and S-3 correspond to physical addresses 1, 2, and 3, respectively. In contrast, only sectors verified as normally recorded sectors are conveniently called logical addresses. The logical addresses are counted from a start address. In FIG. 2, the sectors S-1, S-2, and S-5 correspond to logical addresses 1, 2, and 3, respectively. The subsequent logical addresses are similarly defined.

In the above-described Japanese Patent Application Laid-Open No. 61-243994 or Japanese Patent Application Laid-Open No. 5-250812, information of a defective sector generated in recording data is recorded together with directory information. FIG. 3 is a schematic view showing the defective information in the directory information of information (files F1 and F2) on the optical card 1 shown in FIG. 2. The directory information D1 corresponds to the file F1, and physical addresses 3 and 4 are recorded therein as defective sectors represented as hatched portions. The directory information D2 and D3 correspond to the file F2. Physical addresses 9, 11, 12, 14, 16, and 17 are represented as hatched portions, and all of them are defective sectors. FIG. 3 also shows the correspondence between the physical addresses and the logical addresses.

FIG. 4A is a view showing the format of a user directory used for the above information recording method, and FIG. 4B is a view showing the format of a system directory. These directory formats will be described below. A header is used to identify the user or system directory, and DIRU or DIRS is written in ASCII codes. A system directory number is a serial number commonly used for the system and user directories. A user directory number is a serial number used for only the user directory. A start logical sector address and the number of logical sector managed represent the start logical address of a logical region managed by the directory and the size of the region, respectively. A start physical sector address and the number of physical sector managed represent the start physical address of a physical region managed by the directory and the size of the region, respectively.

A defect list represents defect information constituted by a first address of the successive defective address serving as the start physical address of defective sectors and the number of the successive defective sector. This recording method is very advantageous in that a smaller number of bytes are required for a burst defect. Defect lists 1 to 3 can be recorded in the user directory. Defect lists 1 to 11 can be recorded in the system directory. User directory data is recorded in only the user directory and is constituted by information such as a file name, a file size, and the like.

FIG. 5 is a flow chart showing a process for recording file data in the above method. For example, data of the file F2 having a capacity for four sectors shown in FIG. 2 is assumed to be recorded. Referring to FIG. 5, the host computer 32 issues a recording request to the drive 3,1 and the data of the file F2 is transmitted. The data is sent to the MPU 33 of the drive 31. The MPU 33 stores a start physical address and a start logical address in the internal memory prior to recording of the data (steps S1 and S2). In this example, as is apparent from FIG. 2, the start physical address is "9", and the start logical address is "7". The MPU 33 controls various portions to record the data in the objective sector at physical address 9 (S-9), and immediately reproduces the recorded data to perform verification (step S3).

When verification is ended, the MPU 33 checks to determine if the data is normally recorded (step S4). Since physical address 9 is a defective sector, as shown in FIG. 2, a verify error is detected. When the verify error is detected, the MPU 33 stores the defective sector address in the memory (step S8) and increments the objective physical address by one (step S9), and the flow returns to step S3. In step S3, the data is rerecorded at the next physical address 10, and verification of the data is performed. In this case, as shown in FIG. 2, since physical address 10 is a normal sector, no verify error is detected. The MPU 33 allocates a logical address to the normally written sector, increments the logical address by one for next data recording (step S5), and increments the physical address by one for next data recording (step S6). The MPU 33 checks if all of the data of the file F2 is recorded (step S7). If NO in step S7, the flow returns to step S3, and the same process is repeated. When it is confirmed that all of the data of the file F2 is recorded, the MPU 33 notifies the host computer 32 of an end of recording, and ends the recording process.

FIG. 6 is a flow chart showing the method of recording a directory in the above information recording method. The directory is recorded after all of the data of the file F2 is recorded. FIGS. 7A to 7C are views showing the contents of directories when these directories are recorded in accordance with the flow chart in FIG. 6. Referring to FIG. 6, the MPU 33 prepares a defect list and sector management information on the basis of the defective sector address, the start recording physical address, the end recording physical address, the start recording logical address, and the end recording logical address stored in the memory (step S1). Information such as the defective sector address in the memory is stored when information is recorded as described above. The defect list is prepared before recording of the user directory, and a maximum of three lists are prepared.

The defect lists and the sector management information prepared at this time are shown in FIG. 7B. In FIG. 7B, for example, the start logical sector address is "7" and the start physical sector address is "9". In defect list 1, the first address of the successive defective address is "9" and the number of successive defective sector is "1". In defect list 2, the first address of the successive defective address is "11" and the number of successive defect is "2". In defect list 3, the first address of the successive defective address is "14" and the number of successive defect is "1". Since a maximum of three defect lists can be recorded in the user directory, a defect list with defective start address 16 is not prepared in FIG. 7B.

The MPU 33 records the user directory constituted by the defect lists and the sector management information shown in FIG. 7B on the optical card 1 (step S2). When all of the defect information and the sector management information of the file F2 are recorded in the user directory, the process for recording the directory is ended. More specifically, it is checked to determine if a defect list remains (step S3). If NO in step S3, the process is ended. In this case, as described above, a defect list to be recorded remains. Therefore, the defect list and sector management information to be recorded are prepared (step S4), and a system directory is recorded on the basis of this information (step S5). The MPU 33 repeatedly performs the process of steps S3 to S5 until no defect information exists in the file F2. When all of the data is recorded, the process is ended. FIG. 7C is a view showing the system directory recorded by this method. It is apparent that the remaining defect list and the sector management information about defective sector address 16 are recorded. In this case, since the number of remaining defective sectors is 1, only defect list 1 (the first address of the successive defective address is "16"; the number of successive defective sector is "1") is recorded, as shown in FIG. 7C. However, a maximum of 11 defects lists can be recorded in the system directory. FIG. 7A is a view showing the content of the user directory when the data of the file F1 shown in FIG. 2 is recorded. Since two defective sectors successively exist in the file F1, only defect list 1 (the first address of the successive defective address is "3"; the number of successive defective sector is "2") is recorded. The number of defect lists is less than four. Therefore, the defect list is recorded in only the user directory and is not recorded in the system directory. According to the above information recording method, when the defect information of file data cannot be recorded in the first directory, the remaining defect information can be written in the second directory. Since all of the defect information of the file data can be recorded, the file data can be managed without being impeded.

In the above information recording method, when the host computer designates a logical address to access the information recording/reproducing apparatus, it is necessary to read all directories and store the defect lists in the memory. A process for converting the logical address into a physical address so that the host computer can read the data will be described below with reference to FIG. 8. For example, a process for reproducing data at logical address 6 shown in FIG. 2 will be described below. Referring to FIG. 8, a defect counter Cnt for counting defective sectors is initialized to be "0", and a defect list number Ptr is initialized to be "1" (step S1). It is checked if the number of successive defect in the defect list number Ptr is "0" (step S2). If YES in step S2, it is determined that no defect list exists, and the flow advances to step S6. On the other hand, if NO in step S2, it is determined that a defect list exists. A value obtained by subtracting the defect counter Cnt (=0) from the first address of the successive defective address (=3) of the defect list is compared with given logical address 6 (step S3). In this case, Bad_A(Ptr)-Cnt on the right-hand side in step S3 is a logical address corresponding to the next physical address of the defective sector shown in defect list 1. This is physical address 5 and corresponds to logical address 3. Since, in step S3, given logical address 6 is larger than logical address 3, the umber of successive defect of "2" of defect list 1 is added to Cnt (step S4), and the defect list number Ptr is incremented (step S5). The above process is a process for determining a region to which the objective physical region of regions divided by defect lists belongs. After the process in step S5 is ended, the flow returns to step S2, and the same process as described above is executed. In this case, since next defect list 2 exists in step S2, the process in step S3 is executed again. The current Cnt is "2", and the first address of the successive defective address in defect list 2 is "9". The right-hand side in step S3 thus becomes "7", and the flow advances to step S6 to calculate the physical address. Since Cnt=2 and the given logical address is "6", the physical address becomes "8".

As described above, when the logical address is converted into the physical address to reproduce data accessed by the host computer, the defect lists must be sequentially checked, and all the defect lists must be stored in the memory. For example, assuming that the number of tracks of the optical card is 2,500 and the maximum number of sectors in one track is 16, the maximum number of sectors in the optical card is 40,000 as a whole. Therefore, when a defect list is represented by a 2-byte number for the start defect sector address and a 2-byte number for the number of successive defective sector, i.e., a total of 4 bytes the maximum number of defect lists is 20,000 (=16 sectors×2,500 tracks÷2) lists if a defect exists in every sector. Accordingly, the MPU must have a memory capacity of 80,000 bytes (80 kbytes), i.e., 20,000 lists×4 bytes. As described above, conventionally, when the defect lists are stored in the memory, a large memory capacity is required.

SUMMARY OF THE INVENTION

The present invention has been made in consideration of the above situation, and has as its object to provide an information reproducing method, in which the memory capacity is greatly reduced, thereby providing a compact and inexpensive apparatus.

It is another object of the present invention to provide an improved information reproducing method, in which even if part of a directory or defect information cannot be read in accessing a directory or area storing other defect information prior to information reproduction, data managed by the directories subsequent to the inaccessible directory can be reproduced as far as the subsequent directories can be read.

One of these objects of the present invention can be achieved by an information reproducing method in which directory data for managing file data is recorded on an information recording medium to manage recording/reproduction of the file data, comprising the steps of preparing a defect bit map storing defect information corresponding to each physical address of the recording medium if the physical address is defective, and a defect index table storing the number of defects in each predetermined block on the defect bit map, and when a designated logical address is converted into a physical address, sequentially searching a block on the defect index table where the designated logical address exists, and a physical address in the searched block on the defect bit map.

Another object of the present invention can be achieved by an information reproducing method of reproducing information on an information recording medium having a data region for recording data and a directory region for recording a directory for managing the data in the data region, comprising the steps of reading the directory prior to the reproduction of the data, preparing, on the basis of defect information of the read directory, a physical defect bit map corresponding to each physical address of the recording medium if the physical address is defective, and a physical defect index table representing the number of defects in each predetermined block on the physical defect bit map, preparing a logical defect bit map corresponding to a logical address of the recording medium to represent whether the logical address is defective when an inaccessible directory exists and that the logical address in a logical region managed by the inaccessible directory cannot be read, checking if the logical address is defective with reference to the logical defect bit map when information at the designated logical address is to be read, and searching the physical defect index table and the physical defect bit map, when the designated logical address is not defective, to convert the designated logical address into a physical address and then reproducing the information at the converted physical address.

BRIEF DESCRIPTION OF THE DRAWINGS

FIGS. 4A and 4B are views showing the contents of user and system directories used in the conventional method, respectively;

FIGS. 7A to 7C are views showing the contents of directories recorded by the conventional method of recording a directory in FIG. 6;

FIG. 10 is a view entirely showing defect lists of the directories in FIGS. 7A to 7C;

FIG. 12 is a view showing bytes 0 to 3 of the defect bit map in FIG. 11 in detail;

FIG. 13 is a view showing the recording surface of an optical card used as an information recording medium, and file data, directory information, and physical addresses of sectors recorded thereon;

FIG. 14 is a view showing the defect information of the defect bit map renewed in recording the file F3 of the optical card in FIG. 13;

FIG. 17 is a view showing the contents of the directory information prepared by the method in FIG. 16;

FIGS. 19A and 19B are views showing the contents of directories D1 and D2 of the optical card in FIG. 18, respectively;

FIGS. 20A and 20B are views showing the contents of directories D3 and D4 of the optical card in FIG. 18, respectively;

FIG. 21 is a view showing the content of a directory D5 of the optical card in FIG. 18;

FIGS. 24A and 24B are views showing in detail part of the physical defect bit map together with the physical defect index table, and the physical defect bit map prepared when the directory D1 is read in the embodiment in FIG. 22, respectively;

FIGS. 25A and 25B are views showing in detail the logical defect bit map and part thereof prepared when the directory D5 is read in the embodiment in FIG. 22, respectively;

FIGS. 26A and 26B are views showing in detail part of the physical defect bit map together with the physical defect index table, and the physical defect bit map prepared when the directory D5 is read in the embodiment in FIG. 22, respectively;

FIGS. 28A and 28B are views showing in detail part of the physical defect bit map together with the physical defect index table, and the physical defect bit map prepared when the directory D3 is read after the directories D1 and D5 in the embodiment in FIG. 22, respectively;

FIGS. 29A and 29B are views showing in detail the logical defect bit map and part thereof prepared when the directory D3 is read after the directories D1 and D5 in the embodiment in FIG. 22, respectively.

DETAILED DESCRIPTION OF THE PREFERRED EMBODIMENTS

Figure 11:
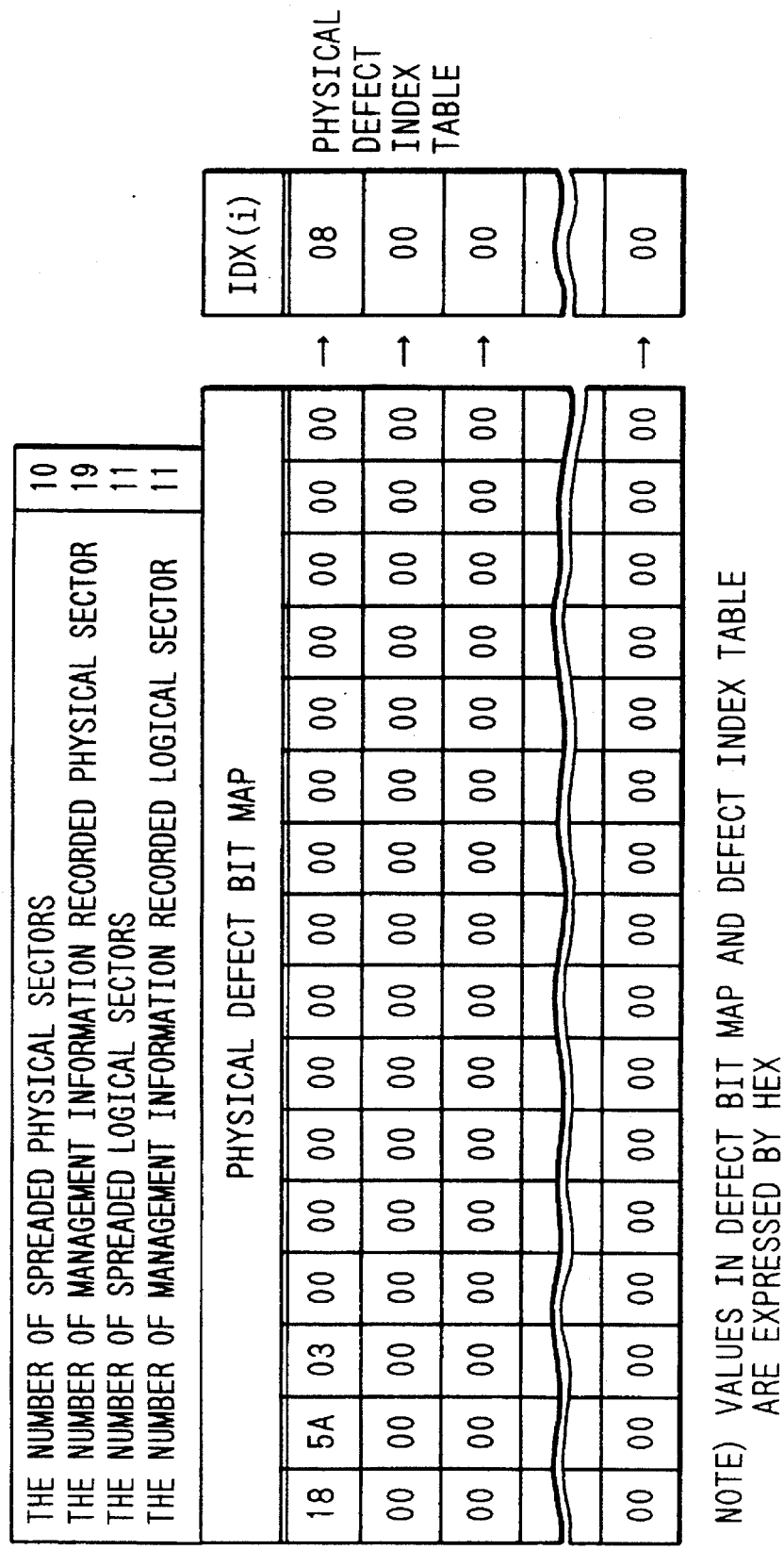
FIG. 11 is a view showing detailed examples of the defect bit map and the defect index table used in the present invention.

An embodiment of the present invention will be described below in detail with reference to the accompanying drawings. The information recording/reproducing apparatus used in this embodiment is the same as that shown in FIG. 1, and a detailed description thereof will be omitted. The information recording method is also basically the same as the conventional method described in FIGS. 2 to 7C and a detailed description thereof will be omitted. FIG. 10 is a view showing all of the defect lists of directories serving as sector management portions shown in FIGS. 7A to 7C. The total number of defect lists is 5, and a first address of the successive defective address and the number of successive defects are shown for each defect list. The total number of defects is 8, which is the sum of the number of successive defects. FIG. 11 is a view showing a defect bit map and a defect index table used for converting a logical address into a physical address. FIG. 11 shows the defect bit map and the defect index table when the directories shown in FIGS. 7A to 7C are spread in the memory. Each defect information of the defect bit map consists of 1 byte (8 bits). One bit of 1 byte of the memory corresponds to one physical sector. That is, defect information for 8 sectors are recorded as 1-byte information.

The number of physical sectors managed by the defect bit map is recorded on it as the number of spread physical sectors. In addition, the number of the physical sector of the sector management information recorded on the optical card as directories is recorded on the defect bit map as the number of the management information recorded physical sector. A value obtained by subtracting the number of the management information recorded physical sector from the number of the spread physical sector is recorded as sector management information for the next recording of directories. The number of the spread logical sector is obtained by subtracting the number of the defective sector from the number of the spread physical sector. The number of the logical sector of the sector management information recorded on the optical card as a directory is recorded on the defect bit map as the number of the management information recorded logical sector.

FIG. 12 is a view showing bytes 0 to 3 of the defect bit map shown in FIG. 11 in detail. In this example, "0" represents a normal physical sector, and "1" represents a defective physical sector. Bits 0 to 7 of byte 0 represent whether physical sectors 0 to 7 are defective. In this case, bits 3 and 4 are "1"s. Therefore, physical sectors 3 and 4 are defective physical sectors. Bits 0 to 7 of byte 1 represent whether physical sectors 8 to 15 are defective, and bits 0 to 7 of byte 2 represent whether physical sectors 16 to 23 are defective. Sectors of "1" are defective sectors. A correspondence between the physical sectors and the defect bit map is obtained by the following expression. The byte position can be calculated in accordance with the following expression. This calculation is performed in the integer range.

$$(\text{physical address}) \div 8 \tag{1}$$

The bit position can be calculated in accordance with the following expression. The calculation is performed in the integer range, and % is an operator for obtaining the remainder of a quotient.

$$(\text{physical address}) \% 8 \tag{2}$$

For example, in defect list 5 shown in FIG. 10, physical sector 16 and physical sector 17 are defective. The positions of these physical sectors in the defect bit map are obtained by expressions (1) and (23) as follows. In physical sector 16, $16 \div 8=2$ and $16 \% 8=0$, and the position of physical sector 16 is defined by the byte 2 and bit 0. In physical sector 17, 17÷8=2 and 17 % 8=1, and the position is defined by byte 2 and bit 1.

The defect index table shown in FIG. 11 will be described below. A defect index byte IDX(i) represents the number of defects from a physical address (i×128) (where i is the position of the defect index byte in the defect index table) to a physical address (i×128+127). That is, the defect index table divides the defect bit map into blocks each consisting of 16 bytes, and stores the number of "1" bits in a block, i.e., the number of defective sectors in 128 sectors in bytes. For example, IDX(0) represents the number of defects from physical address 0 to physical address 127. A correspondence between the physical address and the defect index byte is obtained by the following equation. The defect index byte position i can be obtained as follows.

$$i=(physical\ address)\div 128 \quad (3)$$

This calculation is performed in the integer range.

In this embodiment, the total number of sectors of the optical card is assumed to be 16,384 sectors. The maximum number n of physical sectors in the lateral direction of the defect bit map shown in FIG. 11 is assumed to be 128 (=8 bits×16). In this case, a unit search time Ti (the process time of steps S2 to S4 in FIG. 9 to be described later) of the defect index table is assumed to be the same as a unit search time Tb (the process time of steps S6 to S9 in FIG. 9) of the defect bit map, and the maximum number of physical sectors is defined such that the search time up to the end sector, i.e., the 16,384th physical sector (physical address 16,383) is minimized. Therefore, in order to minimize the search time for defect information, the maximum number n of the physical sectors in the lateral direction of the defect bit map and a number m in the longitudinal direction of the defect index table are preferably defined by equations (4) and (5) as follows.

$$Tb \times n = Ti \times m \quad (4)$$

$$n \times m = total\ number\ of\ sectors \quad (5)$$

Figure 9:
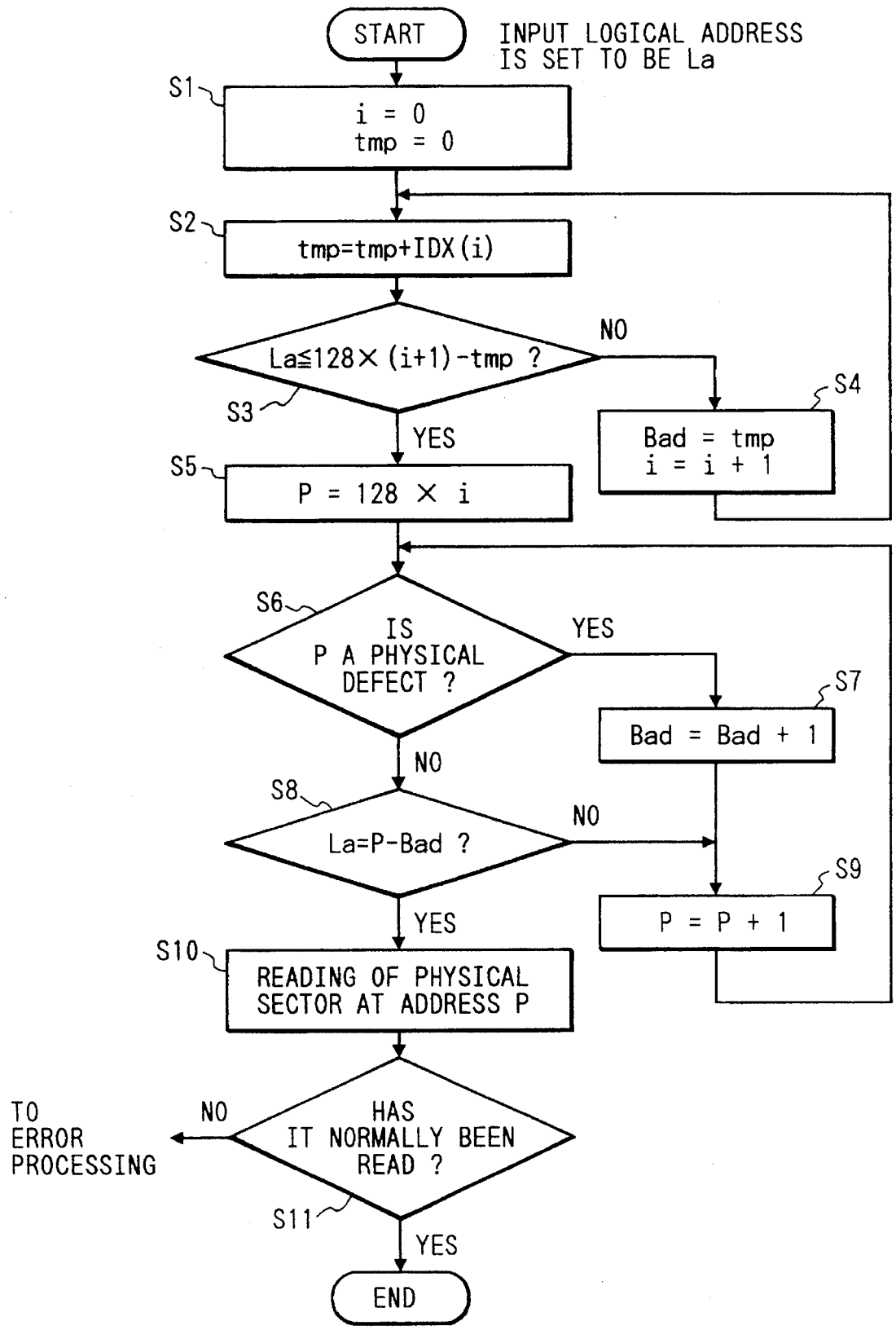
FIG. 9 is a flow chart showing a method of converting a logical address into a physical address by using a defect bit map and a defect index table to read out data according to an embodiment of the present invention.

When the host computer 32 instructs the drive 31 to load data, a logical address is designated as position information to be reproduced, as described above. At this time, the drive 31 loads all the directories of the optical card prior to reading of the data, spreads the sector management information on the defect bit map and the defect index table shown in FIG. 11, and then converts the logical address into a physical address. FIG. 9 is a flow chart showing a process for converting the logical address into the physical address by using the defect bit map and the defect index table to read out the data.

Referring to FIG. 9, when the host computer 32 designates a logical address, the MPU 33 initializes variables i and temp used for converting the logical address into a physical address (step S1). The variable i represents a position in the defect index table, i.e., an order in the longitudinal direction of the defect index table in FIG. 11. The variable temp represents an added value of the defective sectors of the defect index table in FIG. 11. After initialization, a process for searching a block of the defective bit map with the designated logical sector is performed (steps S2 to S4). The number of defective sectors of the first block of the defect index table is searched to check the number of variables temp of the first block (step S2). On the basis of this number, the previously obtained number of variables temp is subtracted from the number of physical sectors (128×(i−1)) existing up to the block i in the defect bit map to obtain the number of physical sectors existing up to the block i (step S3). That is, by calculation of 128×(i+1)− temp, the number of defective sectors is subtracted from the physical sector up to the block i to obtain the number of logical sectors.

When the number of logical sectors is obtained, the number of logical sectors is compared with the logical address La given by the host computer 32 (step S3). If the logical address La is smaller, it is determined that the objective logical address La exists in the block i. The flow advances to step S5, and a process for searching the physical sector corresponding to the objective logical sector in the block i is performed. On the other hand, if the logical address La is larger than or equal to the number of the logical sector, it is determined that the objective address does not exist in the block i, and i is incremented by one (i=i+1) to check the next block (step S4). At this time, as indicated by Bad=temp, the number of variables temp is copied to Bad such that the number of the defective sector up to the block just before the block with the objective logical address can be obtained when the flow advances to step S5. The flow returns to step S2, and the same process is executed. The process of steps S2 to S4 is repeated until the block with the objective logical address La is found.

When the block with the designated logical address La is found, a process for searching the physical sector corresponding to the objective logical address in the block is performed (steps S5 to S9). More specifically, the physical address of the start sector in the block is substituted into P (step S5) to check if the sector of this address P is defective (step S6). If YES in step S6, the number of defect Bad copied in step S4 is incremented (step S7), and the physical address P to be checked is incremented (step S9). The flow returns to step S6 to check if the sector of the physical address P is defective. That is, from the start address of the block with the objective logical address in the defect bit map shown in FIG. 11, it is sequentially checked if the sectors are defective. When a normal sector is found, it is checked if the objective logical address La accords with a value (P−Bad) obtained by subtracting the number of defect Bad from the physical address P (step S8). If NO in step S9, P is incremented in step S9, and the flow returns to step S6 to execute the same process. That is, since the value obtained by subtracting the number of defect Bad from the obtained physical address P is the logical address, if this value accords with the designated logical address La, the physical address P is the objective physical address. The process steps S6 to S9 is repeatedly executed. When the objective physical address P is found, the data of the physical sector at the address P is read out (step S10). It is checked if the data is normally read out (step S11). If YES in step S11, the data is transmitted to the host computer 32 to end the process. On the other hand, if No in step S11, a process for retrying the read access is executed or error processing such as an error notification to the host computer 32 is executed, thereby ending the process.

A method of accumulating defect information generated in recording of data in the defect bit map and a method of recording this information as a directory on the optical card will be described below. An example in which the defect information generated in recording the file F3 on the optical card, as shown in FIG. 13, is spread on the defect bit map will be described. FIG. 13 is a view showing the optical card shown in FIG. 2, on which the file F3 is recorded in addition to the files F1 and F2. S-1 to S-23 represent sectors, and the hatched portions are error sectors (defective sectors) verified after recording. Physical and logical addresses are defined as in the description of FIG. 2. The physical addresses are sequentially counted from the start sector, and the logical addresses are sequentially counted from the start sector of the normal sectors.

When the host computer 32 instructs the drive 31 to record data, the host computer 32 need not designate the logical address because the drive 31 stores the logical address to be recorded next. For this reason, in recording the data, the recording instruction and the data to be recorded are transmitted to the drive 31. When the drive 31 receives the recording instruction and the data to be recorded, recording of the data is started. At this time, the drive 31 determines the start position where the data of the optical card is to be recorded with reference to the defect bit map shown in FIG. 11. In the defect bit map in FIG. 11, since the number of the spread physical sector is "19", the recording start physical address is "19" (S-19) Since the number of the spread logical sector is "11", the logical address to be recorded next is "11". The recording start position is determined in this manner, and recording of the data of the file F3 transmitted from the host computer 32 is started.

In recording the data of the file F3, as shown in FIG. 13, the data is recorded at physical address 19 (S-19). However, since this sector is defective, a recording error occurs. At this time, a process for recording defect information on the defect bit map is performed. More specifically, byte and bit positions on the defect bit map corresponding to physical address 19 are obtained in accordance with the above expressions (1) and (2). The byte position is given as byte 2, and the bit position is given as bit 3. As shown in FIG. 14, the bit at the position of byte 2 and bit 3 is set to be "1" to record that physical address 19 is defective. By using the equation (3), IDX(0) on the defect index table corresponding to physical address 19 is incremented to set the total number of defective sector to be "9". The number of the spread physical sector in the defect bit map is incremented and renewed to be "20".

Renewal of the defect bit map and the defect index table is ended, and the drive 31 records the same data at next physical address 20 (S-20) again. However, since physical address 20 is also defective, an error occurs again. Therefore, a process for renewing the defect bit map and the defect index table is performed again as described above. At this time, the position on the defect bit map corresponding to physical address 20 is defined by byte 2 and bit 4. As shown in FIG. 14, the bit at the position is set to be "1" to record the defect information of physical address 20. IDX(0) of the defect index table is incremented to be "10", and the number of the spread physical sector of the defect bit map is incremented to be "21". Since physical address 20 is defective, the drive 31 records the same data at next physical address 21. Since physical address 21 is a normal sector, defect information is not recorded. The number of the spread physical sector and the number of the spread logical sector on the defect bit map are incremented and renewed to be "22" and "12", respectively.

Figure 15:
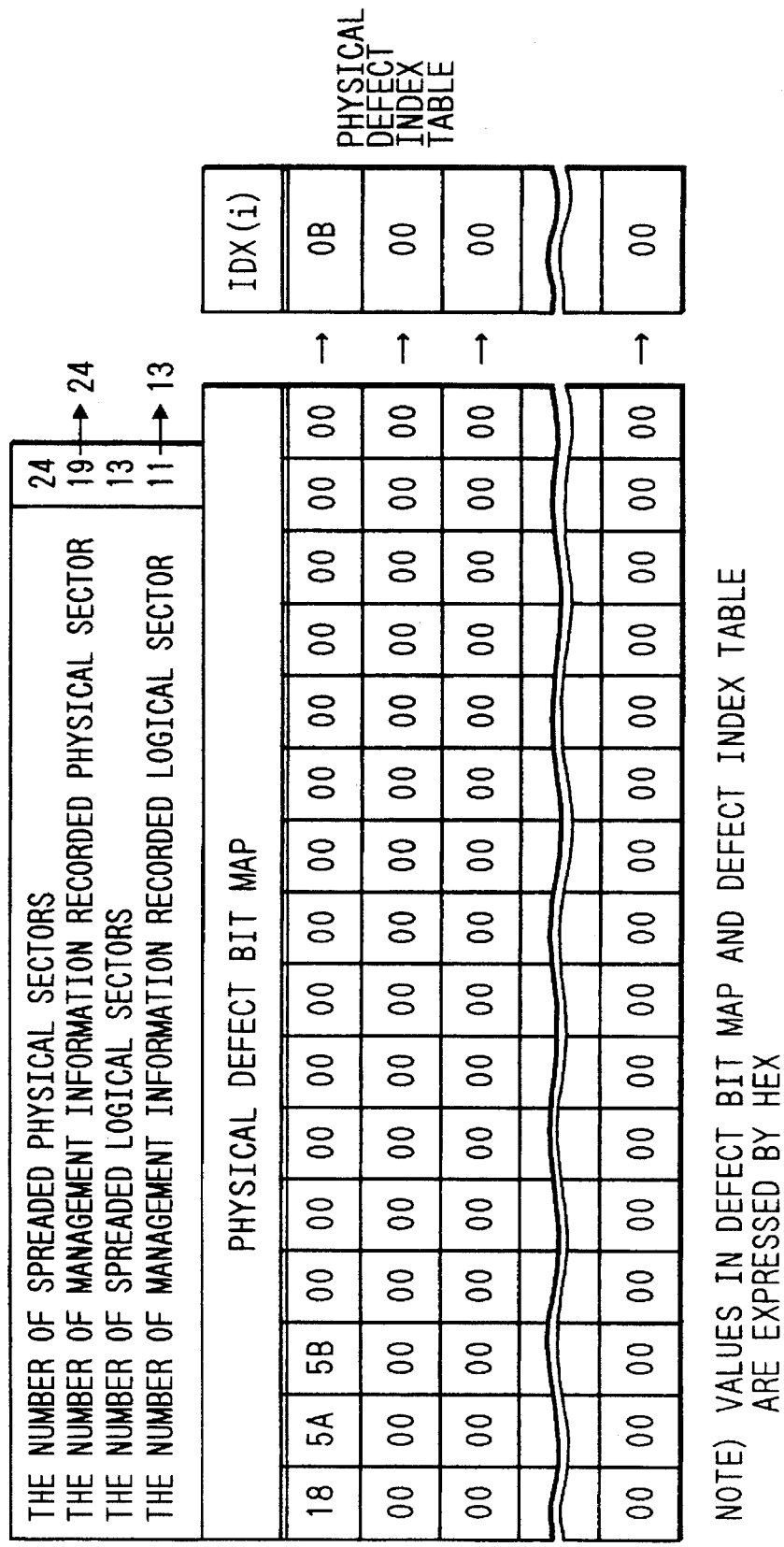
FIG. 15 is a view showing the defect bit map and the defect index table in recording the file F3 in FIG. 13.

After the data is recorded at physical address 21, the drive 31 records the remaining data of the file F3 at next physical address 22 (S-22). However, since physical address 22 is defective, as shown in FIG. 13, defect information is recorded on the defect bit map and the defect index table. In this case, the position on the defective bit map corresponding to physical address 22 is defined by byte 2 and bit 6, and as shown in FIG. 14, the bit at the position is set to be "1" to record that the physical address 22 is defective. IDX(0) on the defect index table and the number of the spread physical sector on the defect bit map are incremented to be "11" and "23", respectively. The same data is recorded at next physical address 23 (S-23) again. Since physical address 23 is a normal sector, defect information is not recorded. The number of spreaded physical sector on the defect bit map and the number of spreaded logical sector are incremented. As a result, as shown in FIG. 15, when the file F3 is recorded, the number of the spread physical sector on the defect bit map and the number of the spread logical sector are renewed to be "24" and "13" respectively The defect information is also spread on the defect bit map in correspondence with the defective physical addresses, as shown in FIG. 14. The recording process of the defect bit map and the defect index table in accordance with recording of the file F3 is ended. When recording of the data of the file F3 is ended, the host computer 32 instructs the drive 31 to record the directory information of the file F3 on the optical card. This directory information is recorded as a user directory in the directories.

Figure 16:
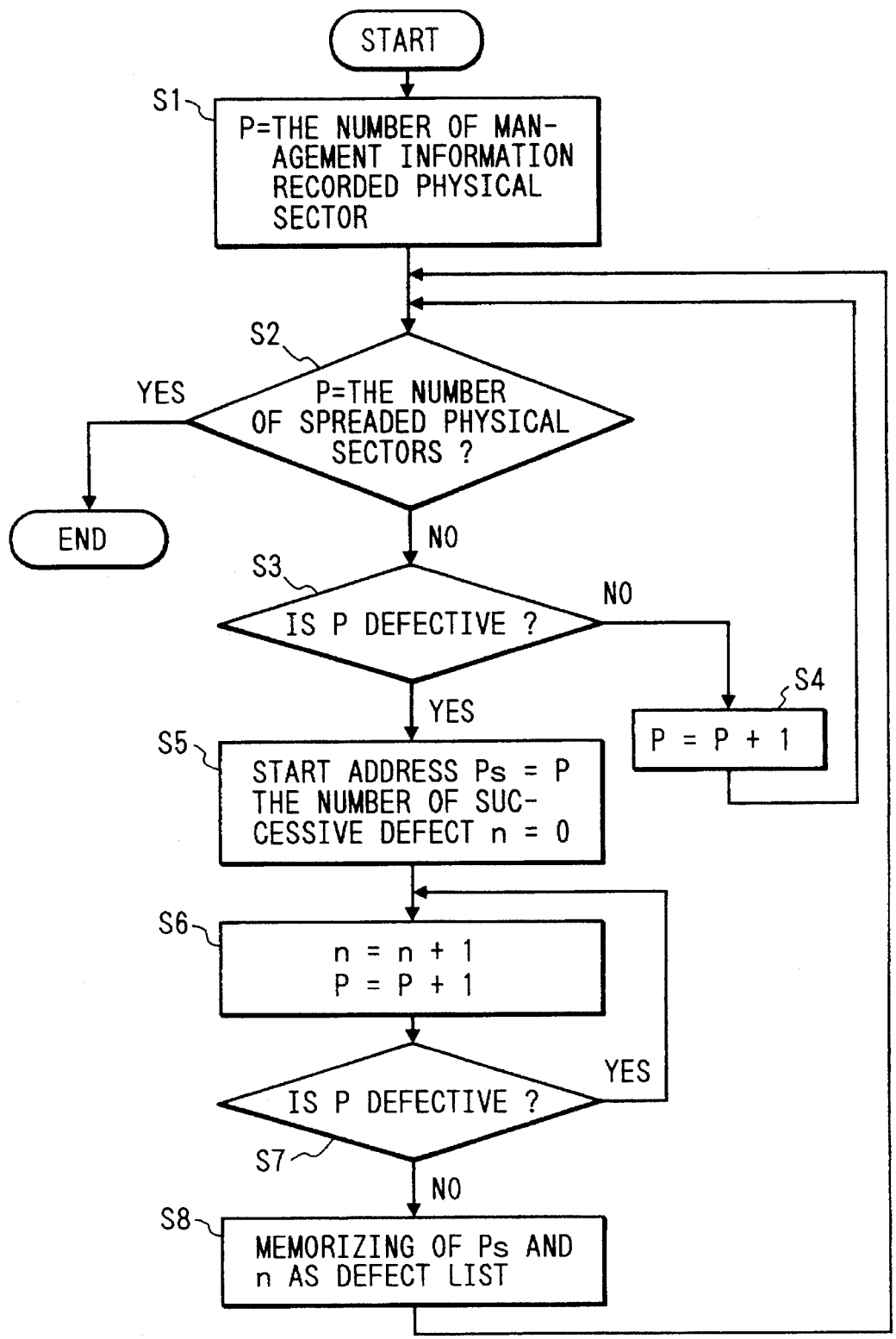
FIG. 16 is a flow chart showing a method of preparing the directory information of the file F3 in FIG. 13 on the basis of the defect bit map according to an embodiment.

FIG. 16 is a flow chart showing a process for recording the directory information on the directory portion of the optical card. Referring to FIG. 16, in order to record the directory information, the MPU 33 in the drive 31 refers to the defect bit map, and substitutes the number of management information recorded physical sectors in the variable P (step S1). The number of management information recorded physical sectors means the total number of physical sectors already managed by the directory among the recorded sectors. The number of the management information recorded physical sector is the same as the start address of the physical sector without the management information and becomes "19" from S-1 to S-19 after the file F3 is recorded (FIGS. 13 and 15). The MPU 33 then refers to the defect bit map to obtain the number of the spread sector, and checks if it accords with the value of the previously substituted P (step S2). The number of the spread physical sector is equal to the start address out of the defect bit map management and is given as "24" after the file F3 is recorded, as shown in FIG. 15. In this case, the number of the spread physical sector does not accord with the value P. It is checked with reference to the defect bit map if the physical address represented by P (address 19) is defective (step S3). If NO in step S3, P is incremented (step S4), and the flow returns to step S2 to execute the same process. That is, it is checked if the physical address is defective whenever the physical address is incremented by one, and when a defect is found, the flow advances to step S5.

In this example, since physical address 19 is defective, the value P is substituted into a start address Ps and 0 is substituted into the number n of successive defects for initialization (step S5). The physical address P at this time is the first address of the successive defective addresses of the defect list. The physical address P and the number n of successive defects are then incremented (step S6), and it is checked if the physical address at this time is defective (step S7). If NO in step S7, the flow advances to step S8 because the defects are not successive. At this time, the physical address to be checked is "20". Since physical address 20 is defective, the flow returns to step S6, and the values n and P are incremented. The number of successive defects is checked in this manner. When a normal physical address is found, the previous first address of the successive defective address Ps and the previous number of successive defects are stored as a defect list in the internal RAM (step S8). In this case, the first address of the successive defective address and the number of successive defects are given as "19" and "2", respectively, and these pieces of information are prepared as defect list 1. The flow returns to step S2, and a process for searching the defective physical address and the number of successive defects as described above is performed. In the file F3, the first address of the successive defective addresses of the next physical address is "22" and the number of successive defects is "1", and this information is prepared as defect list 2. FIG. 17 is a view showing the directory information D4 prepared in this manner. Management information about the file F3 is simultaneously prepared in addition to defect lists 1 and 2. As the management information, for example, a start logical sector address, the number of the management logical sector and the like are prepared. These pieces of directory information D4 are recorded on a directory region 3 of the optical card, as shown in FIG. 13. Since the file F3 is additionally recorded, the number of the management information recorded physical sector on the defect bit map and the number of the management information recorded logical sector are renewed to be 24 and 13, respectively, thereby ending recording of the file F3.

In this embodiment, assuming that the number of tracks of the optical card is 2,500, and the maximum number of sectors of one track is 16, the memory capacity required for the defect bit map is 40 kbits (5 kbytes), i.e., 16 (sectors/track)×2,500. In addition, the memory capacity required for the defect index table is 313 bytes (=16 (sectors/track)×2,500÷128). The total memory capacity is about 5.3 kbytes. Therefore, in comparison with the conventional method of storing all the defect lists in the memory in the same conditions, the method according to this embodiment requires about 1/15 or less of conventional memory capacity, thereby greatly reducing the memory capacity.

Another embodiment will be described below.

In the above-described information reproducing method, when the directory information recorded on the optical card set in the drive is to be read and a directory cannot be read due to some cause, information about defects of directories subsequent to the inaccessible directory cannot be spread on the physical defect bit map and the defect index table even if the subsequent directories can be read. For this reason, the logical address managed by directories subsequent to the inaccessible directory cannot be converted into a physical address. Therefore, for example, when a directory D3 of an optical card in FIG. 18 cannot be read due to dust adhering to the card, even if directories D4 and D5 can be read, the logical addresses of data managed by the directories D4 and D5 cannot be converted into physical addresses, making it difficult to reproduce the data.

Figure 1:
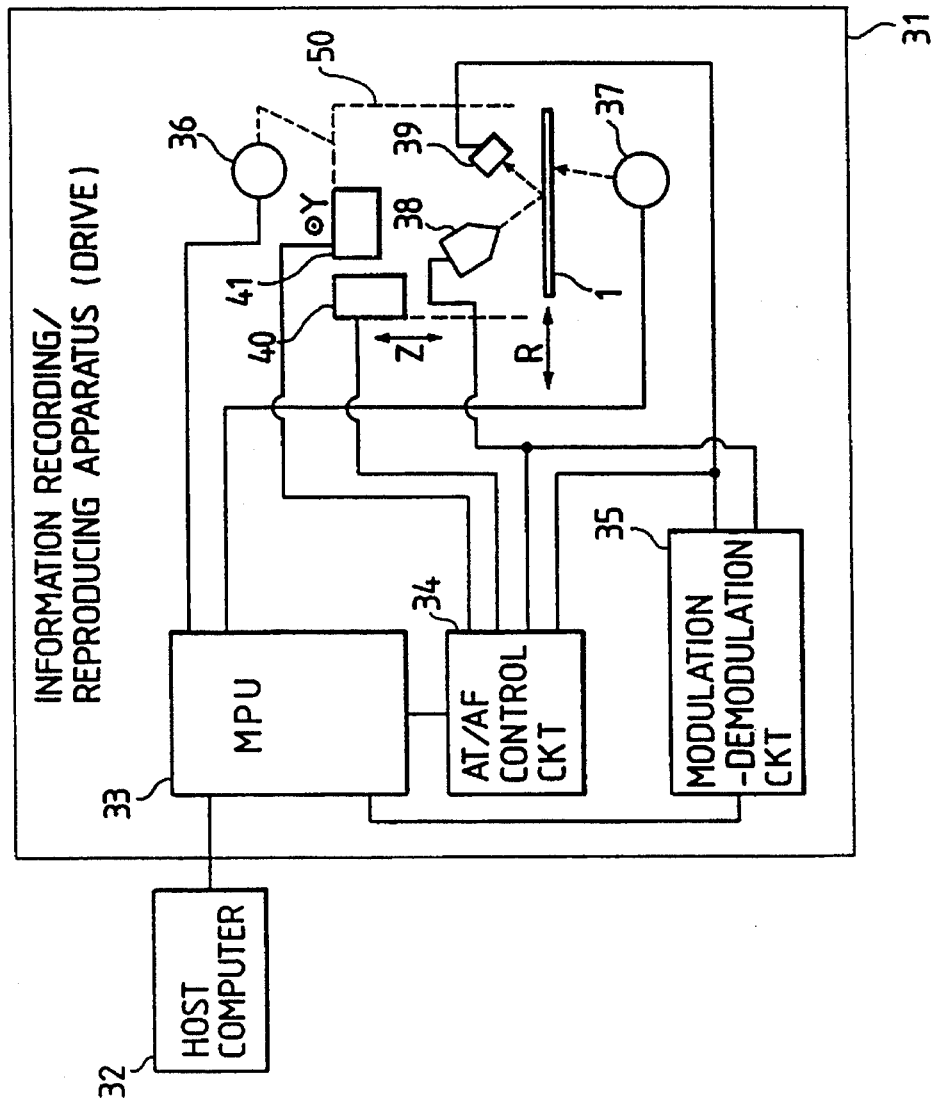
FIG. 1 is a block diagram showing a information recording/reproducing apparatus used for a conventional information recording method.
Figure 2:
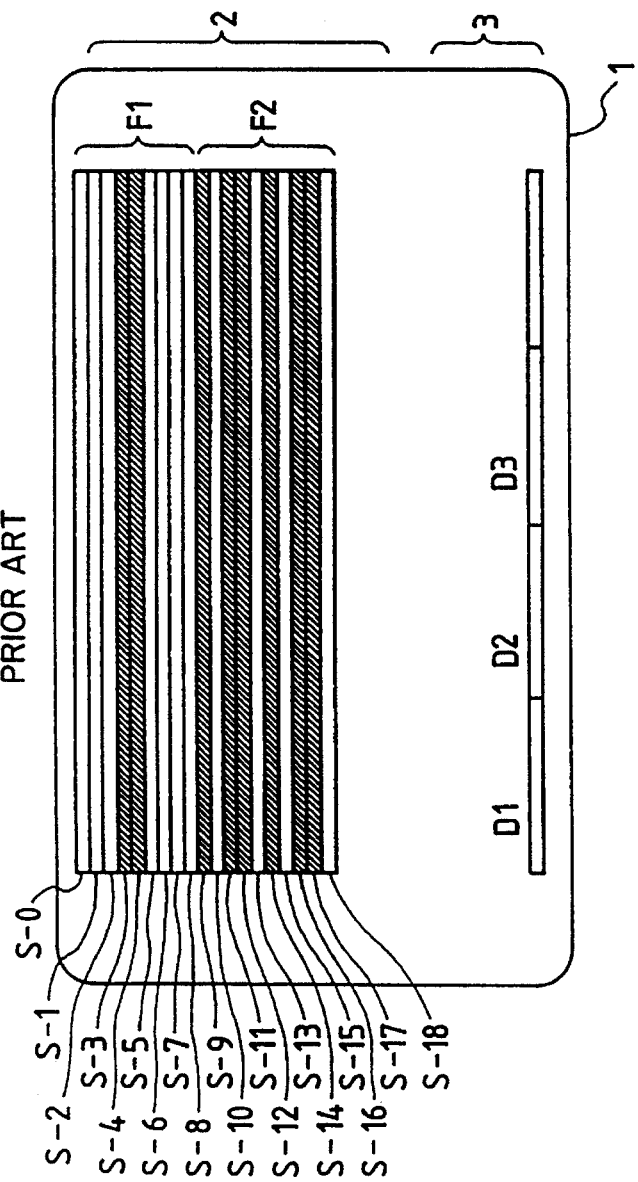
FIG. 2 is a view showing the recording surface of an optical card used for the conventional information recording method.
Figure 3:
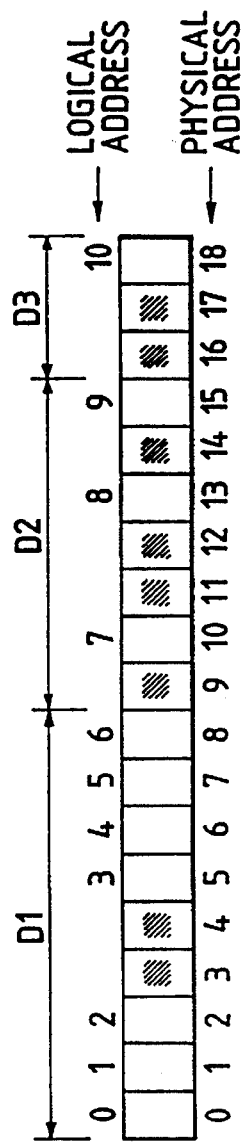
FIG. 3 is a schematic view showing defect information of directory information recorded on the optical card in FIG. 2.
Figure 5:
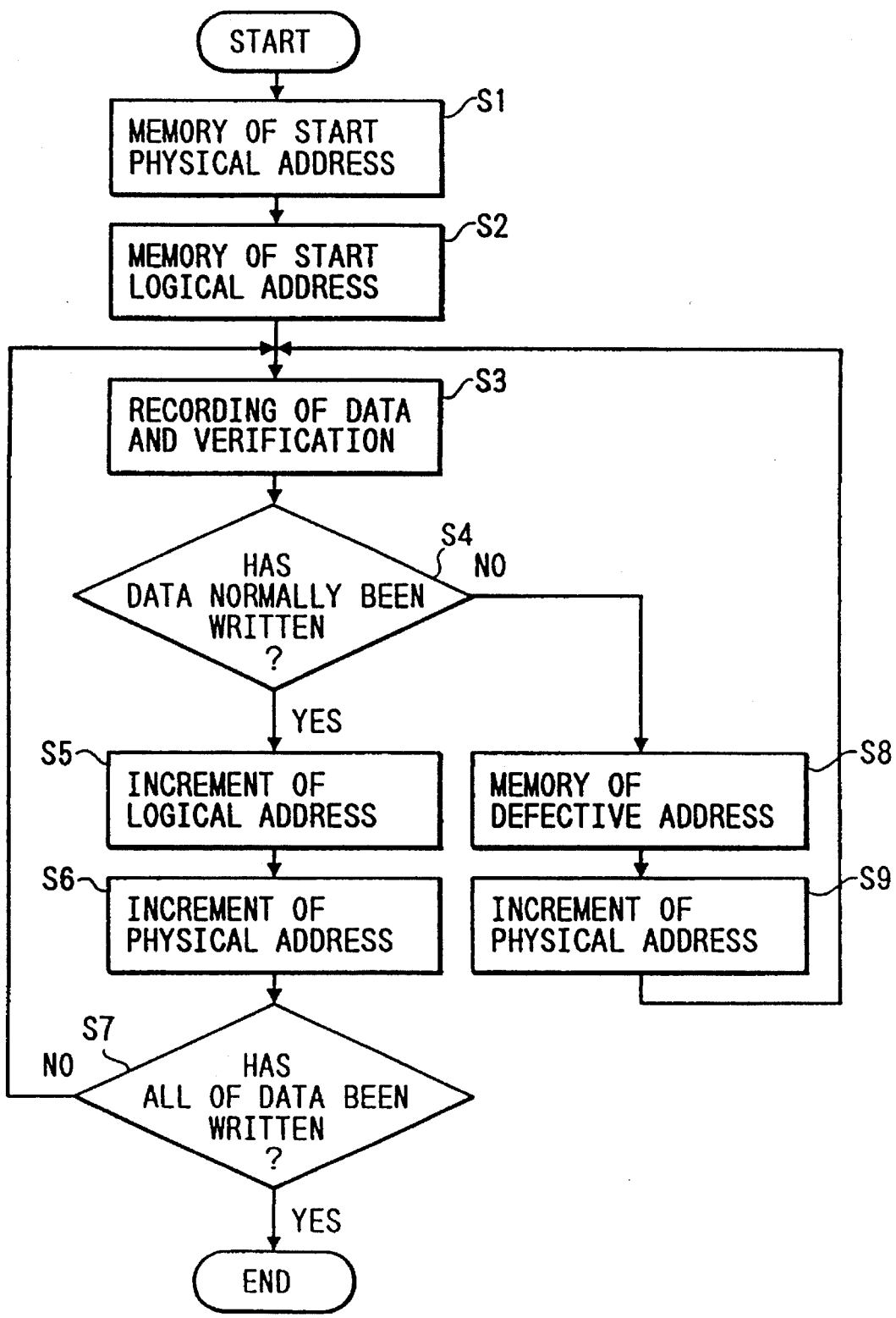
FIG. 5 is a flow chart showing the conventional information recording method.
Figure 6:
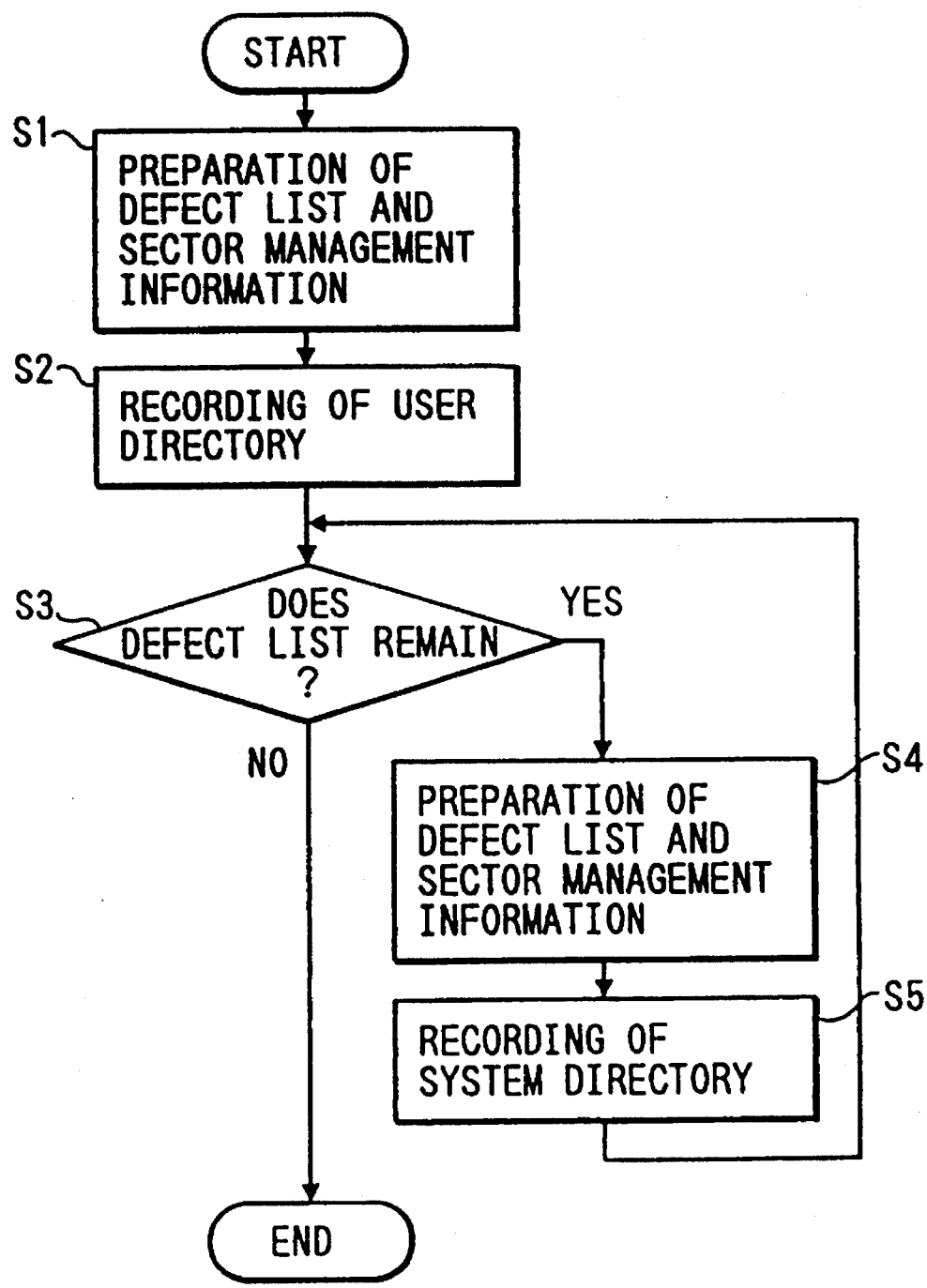
FIG. 6 is a flow chart showing the conventional method of recording a directory.
Figure 8:
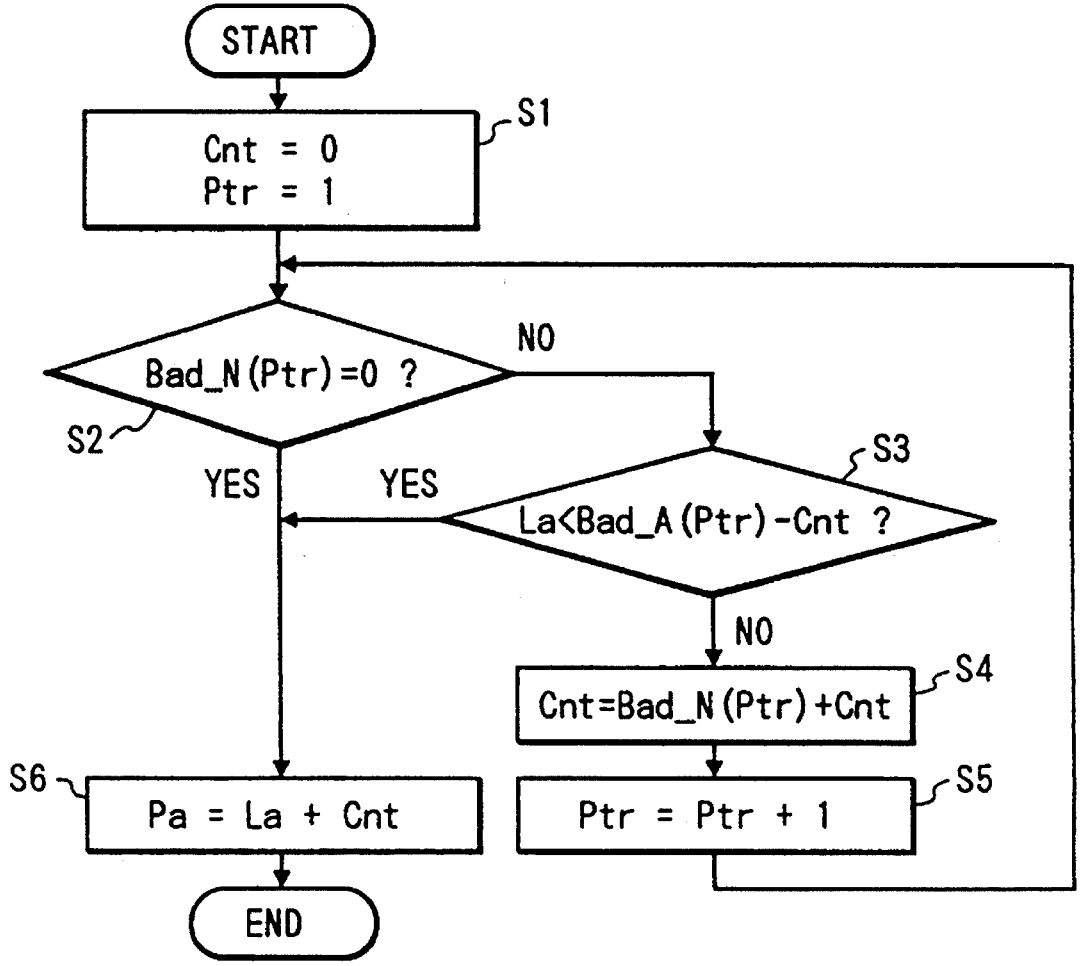
FIG. 8 is a flow chart showing a method of converting a logical address into a physical address to read data in the above information recording method.
Figure 18:
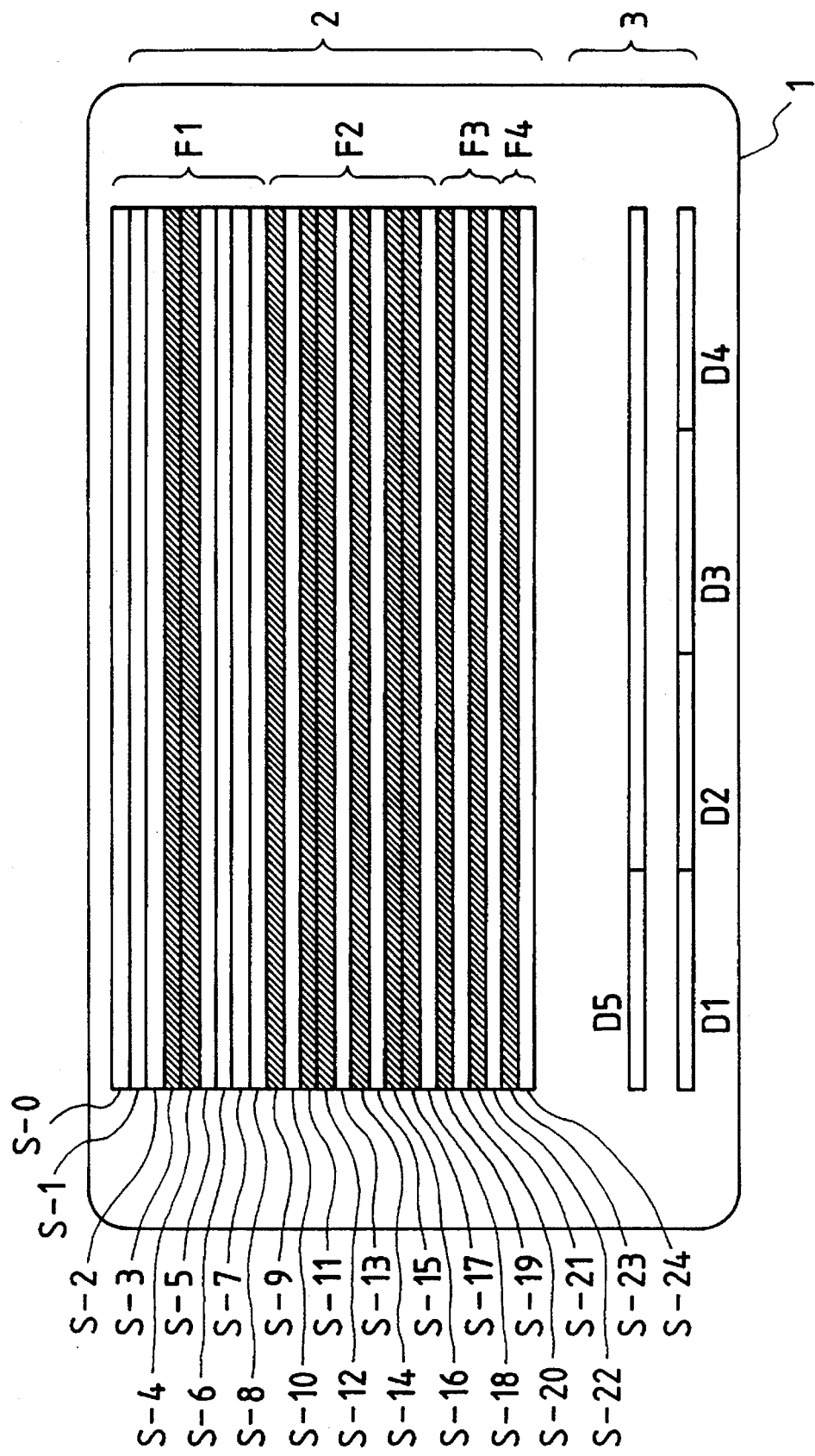
FIG. 18 is a view showing the arrangement of sector addresses, files, and directories on the optical card used as a recording medium in the information recording/reproducing apparatus.

An embodiment for solving the above problem will be described below in detail with reference to the accompanying drawings. In this embodiment, the optical card shown in FIG. 18 is used as a recording medium, and the optical card information recording/reproducing apparatus shown in FIG. 1 is used to record/reproduce the information on this optical card. Files F1 and F4 and directories D1 to D5 in FIGS. 19A to 21 are assumed to be recorded on the optical card in FIG. 18.

Figure 22:
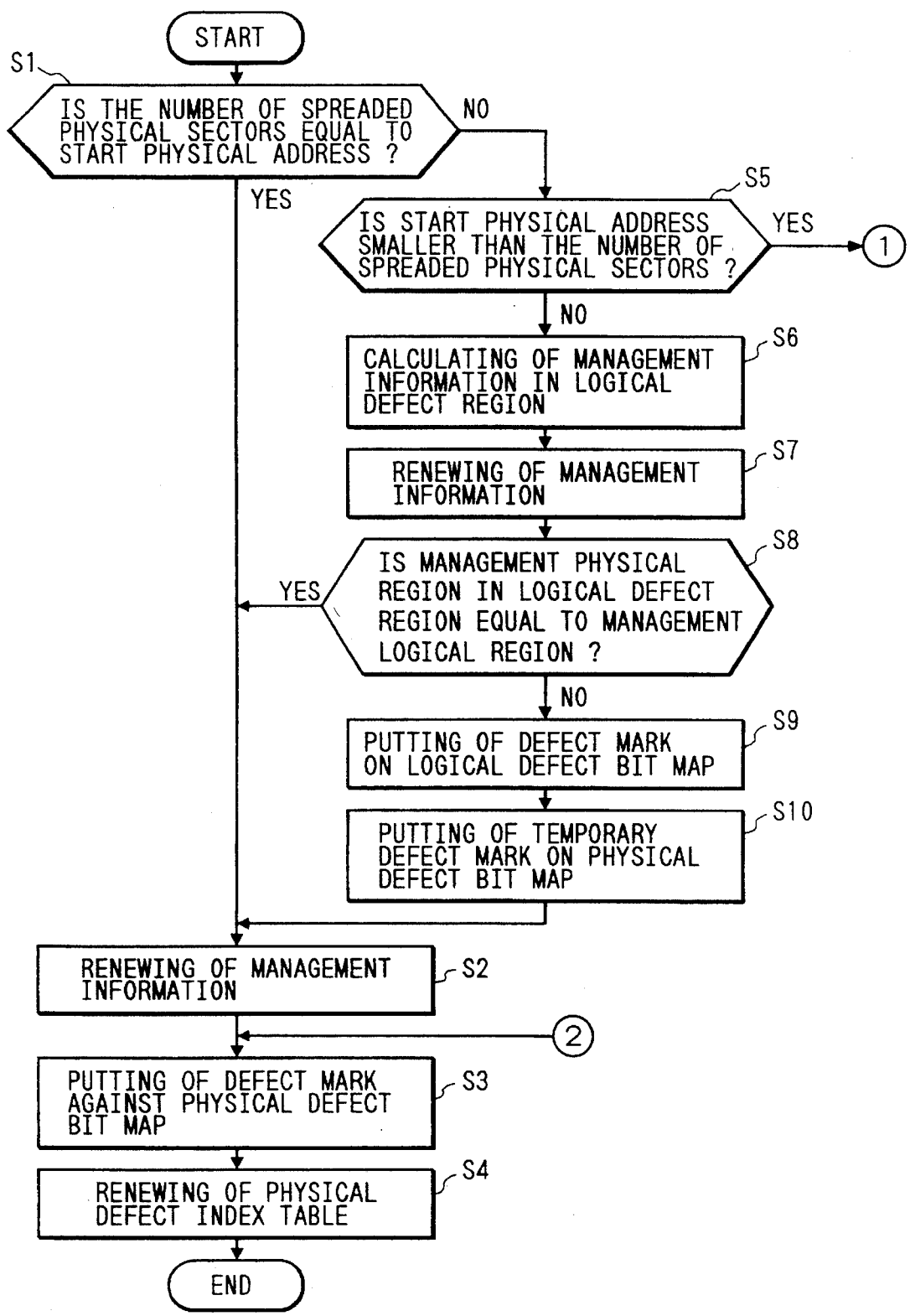
FIG. 22 is a flow chart showing a method of preparing a physical defect bit map, a physical defect index table, and a logical defect bit map on the basis of the directory in the information reproducing method according to another embodiment of the present invention.
Figure 23:
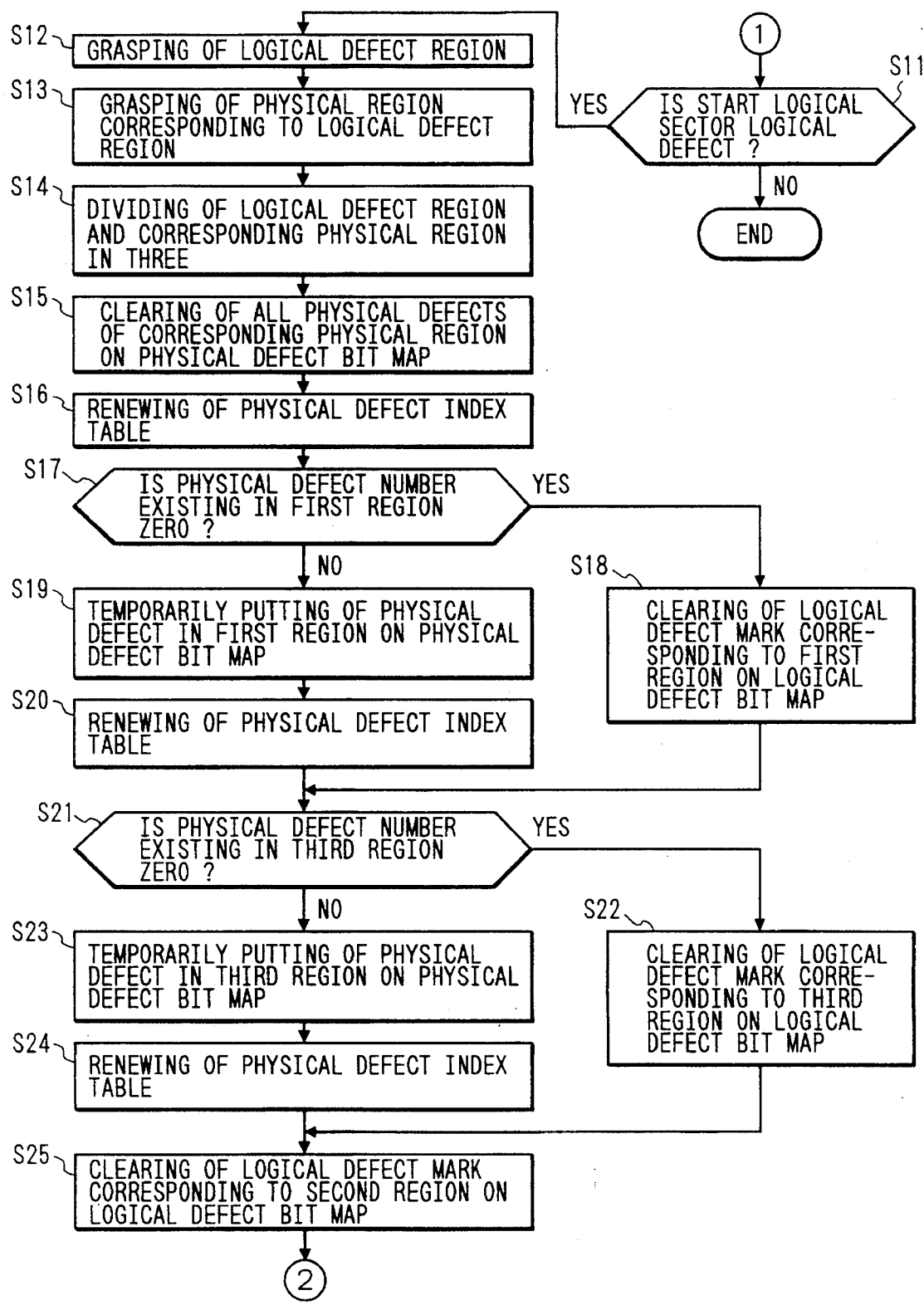
FIG. 23 is a flow chart showing a method of preparing the physical defect bit map, the physical defect index table, and the logical defect bit map on the basis of the directory in the information reproducing method according to the embodiment in FIG. 22.

FIGS. 22 and 23 are flow charts showing an information reproducing method according to an embodiment of the present invention. The information reproducing method according to this embodiment will be described below in detail with reference to FIGS. 22 and 23. When the optical card in FIG. 18 is set in a drive 31 in FIG. 1, the drive 31 reads directories prior to the reproduction of data. A host computer 32 instructs the drive 31 to read the directories, or the drive 31 independently reads the directories. Reading is performed from the start directory D1 in a directory region 3 of the optical card. In this case, the directories D2 to D4 of the optical card are assumed to be inaccessible due to dust or the like.

Referring to FIGS. 22 and 23, when the optical card is set in the drive 31, the start directory D1 is read, and it is checked whether the number of the spread physical sector is equal to a start physical address (step S1). In a state wherein no directory is spread, all of a physical defect bit map, a physical index table, and management information are set to be "0". Therefore, the number of the spread physical sector of the defect bit map management information in step S1 is "0". Since the start physical address of the directory D1 is also "0", as shown in FIG. 9A, it is determined that the number of the spread physical sector is equal to the start physical address in step S1. The management information of the physical defect bit map is then renewed in accordance with the information of the directory D1 (step S2). The renewed physical defect bit map is shown in FIG. 24A.

More specifically, since the number of the spread physical sector is the sum of the number of the current spread physical sector of "0" and the number of the management physical sector of "9" it is renewed to be "9" as shown in FIG. 24A. The number of the management information recorded physical sector is equal to the number of the management physical sector of "9", and is also renewed to be "9". Since the number of the spread logical sector is the sum of the number of the current spread logical sector of "0" and the number of the management logical sector of "7", it is renewed to be "7". The number of the management information recorded logical sector is also renewed to be "7" because the number of the management sector is "7". After the management information is renewed, a process for putting a defect mark on the physical defect bit map in accordance with the defect list of the directory D1 is performed (step S3). When the defect mark is so placed, the byte and bit positions of the defective sector are obtained by performing the above described process. The bit at the position is set to be "1" to put a defect mark. In this case, the directory D1 has one defect list, as shown in FIG. 19A. In accordance with this defect list, the bits at the positions of bit 3 and bit 4 in the byte 0 are set to be "1"s to put defect marks. FIG. 24B is a view showing in detail bytes 0 to 3 of the physical defect bit map in FIG. 24A. The physical defect index table is renewed by the above method, as shown in FIG. 24A (step S4). The process for spreading the directory D1 on the physical defect bit map and the physical defect index table is ended.

Then, directories subsequent to the directory D2 are sequentially read. In this case, since the directories D2 to D4 are inaccessible, the directories D2 to D4 fail to be read. Therefore, the next directory D5 is to be read. This process will be described with reference to FIGS. 22 and 23. If the directories D2 to D4 are accessible, the directories D2 to D4 are sequentially spread on the physical defect bit map and the physical defect index table as in the above case. When the directory D5 is to be read, a logical defect bit map (to be described later in detail) is prepared in addition to the physical defect bit map and the physical defect index table.

When the directory D5 is to be read, in step S1 in FIG. 22, the number of the spread physical sector is "9", and the start physical address of the directory D5 is "23 ", as shown in FIG. 24A. In this case, the flow advances to step S5 to check if the start physical address of the directory D5 is smaller than the number of the current spread physical sector (step S5). Since the number of the spread physical sector is "9", and the start physical address of the directory D5 is "23" the determination result is NO. Therefore, a process for calculating the management information in the logical defect region, i.e., the defect directories (directories D2 to D4) from the physical defect bit map and the directory D5 is performed (step S6). The detailed method is as follows.

As management information in the logical defect region, there are the start physical address in the logical defect region, the size of the logical defect region, the start physical address in the physical region corresponding to the logical defect region, the size of the physical region corresponding to the logical defect region, and the number of the defective sector in the physical region corresponding to the logical defect region. The start logical address in the logical defect region is equal to the number of the current spread logical sector on the physical defect bit map and is given as "7". The size of the logical defect region is given as "6" by subtracting the number of the spread logical sector of "7" from the start logical address 13 of the directory D5. The start physical address in the physical region corresponding to the logical defect region is equal to the number of the current spread physical sector on the physical defect bit map and is given as "9". The size of the physical region corresponding to the logical defect region is given as "14" by subtracting the number of the spread physical sector of "9" from start physical address 23 of the directory D5. Finally, the number of the defective sector in the physical region corresponding to the logical defect region is given as "8" by subtracting the size of "6" of the logical defect region from the previously obtained size of "14" of the physical region corresponding to the logical defect region.

When calculation of the management information in the logical defect region is ended, a process for renewing the management information on the physical defect bit map in FIG. 24A is performed on the basis of the obtained management information (step S7). More specifically, the number of the spread physical sector is renewed to be "23" by adding the size of "14" of the physical region corresponding to the logical defect region to the number of the current spread physical sector of "9". The number of the management information recorded physical sector is renewed to this value of "23" of the number of the spread physical sector. The number of the spread logical sector is renewed to be "13" by adding the size of "6" of the logical defect region to the number of the current spread logical sector of "7". The number of the management information recorded logical sector is renewed to this obtained value of "13" of the number of the spread logical sector. Renewing of the management information on the physical defect bit map is now ended.

It is checked if the size of the logical defect region is equal to the size of the physical region corresponding to the logical defect region (step S8). If YES in step S8, no physical defect exists in the region managed by the directories D2 to D4. If NO in step S8, a physical defect exists in the region managed by the directories D2 to D4. In this case, the size of the logical defect region is "6", and the physical region corresponding to the logical defect region is "14". Since the sizes of the two regions are different from each other, a physical defect exists in the region managed by the directories D2 to D4. If the two regions have the same size, a process for spreading the directory D5 on the physical defect bit map and the physical defect index table is performed in steps S2 to S4.

In this case, since the sizes of the two regions are different, a process for putting a defect mark for the logical defect region on the logical defect bit map is performed (step S9). More specifically, as described above, since the start logical address of the logical defect region is "7", and the size of the logical defect address is "6", six bits from logical address 7 are set to be "1"s, as shown in FIG. 25B, to put the defect marks. FIG. 25A is a view showing the logical defect bit map, and FIG. 25B is a view showing bytes 0 to 3 thereof in detail. The logical defect bit map is prepared by causing one logical sector of the optical card to correspond to 1 bit of the memory. As described above, when a logical sector is defective, the corresponding bit is set to be "1" to put a defect mark.

A process for temporarily putting a defect mark on the physical defect bit map in correspondence with the defect mark in the logical defect region is performed (step S10). More specifically, since the start physical address is "9", and the number of the defective sector in the physical region corresponding to the logical defect region is "8", 8 bits from the bit position corresponding to physical address 9 are set to be "1"s, as shown in FIG. 26B, to temporarily put the defect marks. Subsequently, a process for spreading the directory D5 on the physical defect bit map and the physical defect index table is performed in steps S2 to S4.

In the directory D5, as shown in FIG. 21, the number of the management logical sector is "1" and the number of the management physical sector is "2". Therefore, as shown in FIG. 26A, "2" is added to the number of the spread physical sector of "23" to renew the number of the spread physical sector and the number of the management information recorded physical sector to be "25". In addition, "1" is added to the number of the spread logical sector of "13" to renew the number of the spread logical sector and the number of the management information recorded logical sector to be "14". A defect mark is put on the physical defect bit map in correspondence with the defect list of the directory D5 (the first address of the successive defective address is "23" and the number of successive defective sectors is "1"), as shown in FIG. 26B. That is, the bit at the position of byte 2 and bit 7 is set to be "1" to put the defect mark. The spreading process of the physical defect bit map, the physical defect index table, and the logical defect bit map in reading of the directories D1 and D5 is ended.

A method of spreading the physical defect bit map, the physical defect index table, and the logical defect bit map when the directories are read again and when the directory D3 can be read will be described with reference to FIGS. 22 and 23. In step S1 in FIG. 23, when the directories D1 and D5 are spread, the number of the spread physical sector is "25", as shown in FIG. 26A, and the start physical address of the directory D3 is "16", as shown in FIG. 20A At this time, the flow advances to step S11 in FIG. 23 through step S5, and it is checked if the logical sector managed by the directory D3 is a logical defect. In fact, all the logical sectors need not to be checked. It is sufficient to check only the start logical sector. If NO in step S11, it is determined that the read directory is normally spread, and the process is ended. In this embodiment, since the logical sector managed by the directory D3 is a logical defect, as shown in FIG. 25B, the flow advances to step S12 to perform a process for grasping the logical defect region.

More specifically, a process for checking the size of the successive logical defect region including the logical region of the directory D3 with reference to the logical defect bit map is performed. At this time, the size of the logical defect region ranges from start address 7 to end address 12 in the logical defect region, as shown in FIG. 25B. A process for grasping the physical region corresponding to the obtained logical defect region is then performed (step S13). When the start address in the physical region corresponding to the logical defect region is to be obtained, a physical address corresponding to the logical address just before the start address of the logical defect region is obtained, and the next address is obtained as the start address in the physical region. In this case, the start address of the physical region corresponding to the logical defect region "9". However, if the start address in the logical defect region is "0", the start address in the physical region is also set to be "0". When the end address in the physical region corresponding to the logical defect region is to be obtained, a physical address corresponding to the logical address subsequent to the end address in the logical defect region is obtained, and an address just before the address is obtained as the end address in the physical region. In this case, the end address in the physical region corresponding to the logical defect region is "22".

The physical defect mark on the physical region corresponding to the logical defect region is a temporary mark and does not exactly indicate the position of the physical defect. This mark indicates only the number of the physical defect from the start address of the physical region as defects. In this state, it is difficult to spread the directory D3 on the physical defect bit map. Therefore, the physical defects must be rearranged to divide the logical defect region into three parts before and after the directory D3 to specify the region corresponding to the directory D3 before the directory D3 is spread.

A process is performed for dividing the physical region (region of physical addresses 9 to 22) corresponding to the logical defect region (region of logical addresses 7 to 12) into three regions, i.e., a region corresponding to the directory D3 and two regions before and after it (step S14). In this case, the region of the directory D3 is the second region, the region before it is the first region, and the region after it is the third region. The detailed dividing method is as follows.

As for the first region, the start logical address in the first region is start address 7 in the logical defect region. The size of the logical region of the first region is given as "3" by subtracting start address 7 of the logical defect region from start logical address 10 of the directory D3. The start physical address in the first region is start address 9 in the physical region corresponding to the logical defect address. The size of the physical region of the first region is given as "7" by subtracting start address 9 in the physical region corresponding to the logical defect region from start physical address 16 of the directory D3. The number of the physical defect in the first region is given as "4" by subtracting the size of "3" of the logical region from the size of "7" of the physical region. The second region is the region managed by the directory D3.

Figure 27:
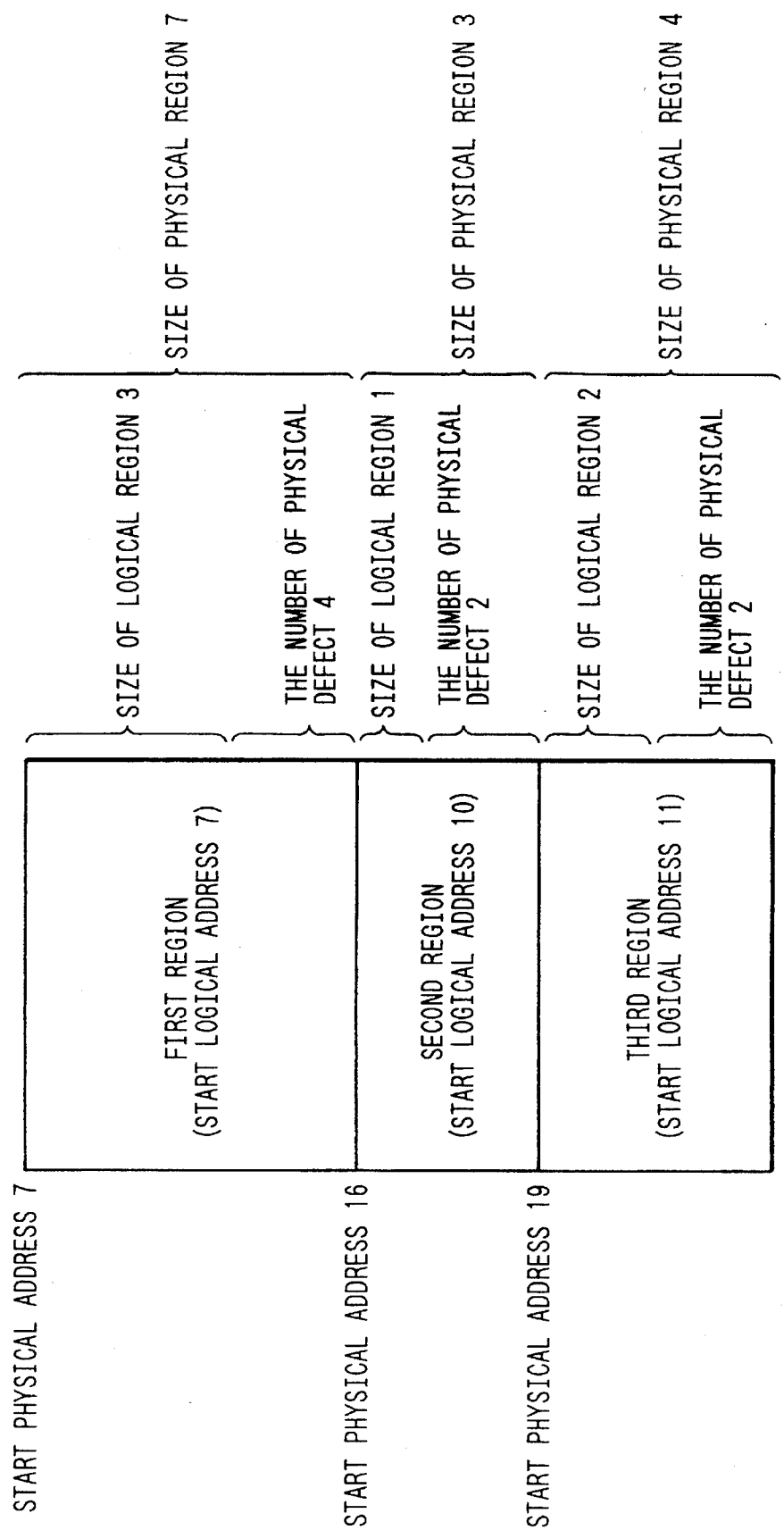
FIG. 27 is a schematic view showing a state in which a logical defect region is divided into three regions in the embodiment in FIG. 22.

As for the third region, the start logical address in the third region is given as "11" by adding the number of the management logical sector of "1" of the directory D3 to start logical address 10 of the directory D3. The size of the logical region of the third region is given as "2" by adding "1" to end address 12 in the logical defect region and subtracting start logical address 11 of the third region from address 13. The start physical address in the third region is given as "19" by adding the number of management physical sector of "3" of the directory D3 to start physical address 16 of the directory D3. The size of the physical region of the third region is given as "4" by adding "1" to end address 22 in the physical region corresponding to the logical defect region and subtracting the added value of "19" of start physical address 16 and the value of "3"0 of the number of the management physical sector of the directory D3 from the value of "23". The number of the physical defect in the third region is given as "2" by subtracting the size of "2" of the logical region from the size of "4" of the physical region. FIG. 27 is a schematic view showing the three-divided logical defect region.

When the dividing process is ended, all defect marks corresponding to the logical defects on the physical defect bit map are cleared (Step S15). Accordingly, the physical defect index table is renewed (step S16). It is checked if the number of the physical defect existing in the first region is "0" (step S17). If YES in step S17, the logical defect mark corresponding to the first region on the logical defect bit map is cleared (step S18). In this case, since the number of the physical defect in the first region is "4", a process for temporarily putting a physical defect on the physical defect bit map is performed (step S19). In this embodiment, the defect marks are continuously put for the number of the physical defect of "4" from the bit corresponding to physical address 9, as shown in FIG. 28B. The defect mark can be put at any bit position corresponding to the first region. As shown in FIG. 28A, the physical defect index table is renewed in accordance with the change of the physical defect bit (step S20).

It is checked if the number of physical defect existing in the third region is "0" (step S21). If YES in step S21, the logical defect mark corresponding to the third region on the logical defect bit mark is cleared (step S22). In this case, since the number of the physical defect in the third region is "2", defect marks are temporarily put on the physical defect bit map at bits corresponding to physical addresses 19 and 20 (step S23). Accordingly, the physical defect index table is renewed (step S24). The defect mark can be put at any bit position corresponding to the third region. The logical defect mark corresponding to the second region on the logical defect bit map is cleared, and the logical defect bit map is renewed in accordance with reading of the directory D3 (step S25).

In this case, since the logical sector address managed by the directory D3 is "10", as shown in FIG. 20A, the defect mark at the bit position corresponding to logical address 10 is cleared, as shown in FIGS. 29A and 29B. The flow returns to step S3 in FIG. 22. The physical defect bit map and the physical defect index table are renewed in accordance with the defect list of the read directory D3 (steps S3 and S4). The defect list of the directory D3 is defect list 1 (the first address of the successive defective addresses is "16" and the number of successive defective sectors is "2"), as shown in FIG. 20A. Therefore, as shown in FIG. 28B, bit positions (byte 2, bits 0 and 1) corresponding to defect addresses 16 and 17 are set to be "1"s, respectively, to put defect marks. The spreading process of the physical defect put map, the physical defect index table, and the physical defect bit map when the directory D3 is read is ended.

When directories are further read, and the inaccessible directory D2 or D4 can be normally read, the defect mark on the corresponding logical defect bit map may be cleared. In addition, the physical defect bit map and the physical defect index table may be renewed in accordance with the defect lists of the directories D2 and D4. As a result, in this embodiment, when the logical defect region is divided, the first and third regions correspond to the directories D2 and D4, respectively. However, the number of directories corresponding to each region may be 0 or two or more.

Figure 30:
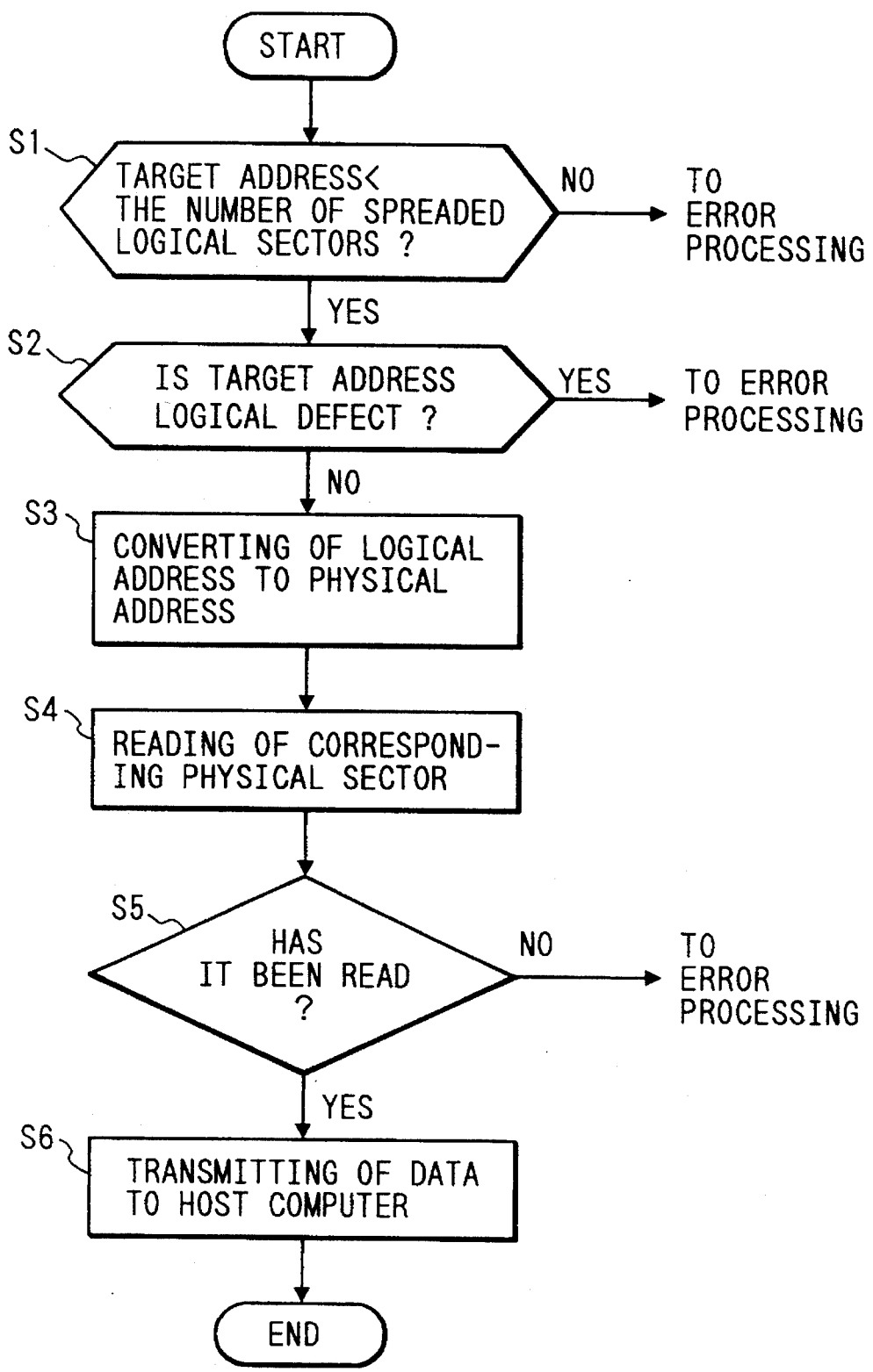
FIG. 30 is a flow chart showing a method of reading data at the logical address designated by the host computer by using the physical defect bit map, the physical defect index table, and the logical defect bit map.

A method of reading data by using the prepared physical defect bit map, the physical defect index table, and the logical defect bit map will be described below with reference to the flow chart in FIG. 30. Referring to FIG. 30, when information is to be reproduced, a reproduction instruction is issued by the host computer 31 in FIG. 1 to the drive 31, and a logical address is designated as position information to be reproduced. When the drive 31 receives the reproduction instruction and the objective logical address, the objective logical address is compared with the number of the spread logical sector with reference to the management information of physical defect bit map (step S1). If the logical address is larger than the number of the spread logical sector, it is determined that the designated logical address is an unrecorded sector, and the designation by the host computer 32 is an error. The host computer 32 is notified of it and an error processing operation is performed. On the other hand, if the logical address is smaller than the number of the spread logical sector, it is determined that information is already recorded at the designated logical address. A process is performed for checking if the objective logical address is a logical defect with reference to the logical defect bit map (step S2).

One bit is caused to correspond to each logical address of the optical card to record defect information on the logical defect bit map, as described above. It is checked if the objective logical address is a logical defect with reference to the bit information at the bit position corresponding to the objective logical address. If a defect mark of "1" is recorded at the bit position corresponding to the objective logical address, this logical address corresponds to an inaccessible directory. It is determined that reproduction of data is difficult, and error processing is performed. On the other hand, if the bit position corresponding to the objective logical address is set to be "0", it is determined that the data can be reproduced, and a process for converting the designated logical address into a physical address is performed (step S3).

The method of converting the logical address into the physical address has been described in FIG. 9, and a detailed description will be omitted. The physical defect index table and the physical defect bit map are searched to obtain the physical address corresponding to the logical address. The data at the corresponding physical address of the optical card is read (step S4), and it is checked if the data is normally read (step S5). If the data is not normally read, an error processing operation is performed. If the data is normally read, the data is transmitted to the host computer 32 to end the process (step S6).

In the above embodiments, a recording medium having defect information in a directory region is used. However, the present invention is not limited to such a medium and can be applied to, for example, a recording medium having a data region a directory region, and a defect information management region in different regions.

As has been described above, according to the present invention, defect information on the information recording medium is spread on a defect bit map and a defect index table in correspondence with each physical address. Therefore, the memory capacity required to record defect information can be greatly reduced as compared to the prior art to provide a compact and inexpensive apparatus.

Further, according to the present invention, a logical defect bit map is prepared, in addition to the physical defect bit map and the physical defect index table, to record defect information at the logical address in a logical region managed by an inaccessible directory. For this reason, even if an inaccessible directory exists, defect information about the subsequent directories can be spread on the physical defect bit map and the physical defect index table. Therefore, even if a directory cannot be read due to some cause, as far as the subsequent directories can be read, the logical address can be converted into the physical address for the data managed by the accessible directory, and the data can be reproduced.

What is claimed is:

1. An information reproducing method for an information recording medium storing file data and directory data for managing the file data, comprising the steps of:

the recording medium representing whether each physical address is defective, the defect information including the number of spread physical sectors and the number of management information recorded physical sectors;

preparing a physical defect index table storing the total defect number of each predetermined block on the defect bit map;

searching a block where a desired logical address exists on the basis of the physical defect index table; and searching a physical address corresponding to the desired logical address in the searched block on the physical defect bit map.

2. A method according to claim 1, wherein said physical defect bit map preparing step comprises the step of storing defect information in the defect bit map by causing one physical address of the information recording medium to correspond to one bit.

3. A method to claim 1, further comprising the step of setting the number of blocks m on the defect index table and the number of physical addresses of one block on the defect bit map to Tb×n Ti×m such that a time required to search the physical address is minimized, where Tb is a unit search time of the defect bit map, and Ti is a unit search time of the defect index table.

4. A method according to claim 1, further comprising the step of renewing the defect information of the defect bit map and the defect index table whenever a defect is detected in recording data.

5. An information reproducing method reproducing information from an information medium having a data region for recording data and a directory region for recording a directory for managing the data, comprising the steps of:

reading the directory prior to reproduction of the data;

preparing, on the basis of defect information of the read directory, a physical defect bit map corresponding to each physical address of the recording medium if the physical address is defective;

preparing a physical defect index table representing the number of effects in each predetermined block on the physical defect bit map;

preparing a logical defect bit map corresponding to a logical address managed by an inaccessible directory and other logical addresses when the inaccesssible directory exists, and recording defect information on the bit map corresponding to the logical address in a logical region managed by the inaccessible directory;

checking if the logical address is defective with reference to the logical defect bit map when information at the designated logical address is to be read; and when the designated logical address is not defective, searching the physical defect index table and physical defect bit map to convert the designated logical address in to a physical address.

6. A method according to claim 5, further comprising the step of recording the physical defect in the physical region managed by said inaccessible directory onto the physical defect bit map.

7. A method according to claim 5, further comprising the step of storing with the logical defect bit map defect information of each 1-bit physical address with a "1" or a "0", corresponding to each logical address of the recording medium.

8. A method according to claim 5, further comprising the step of storing with the logical defect bit map defect information of each 1-bit physical address with a "1" or a "0", corresponding to each logical address of the recording medium.

9. A method of reproducing information from a write once information recording medium having a data portion for recording a file comprising a plurality of physical sectors, and a sector management portion for managing physical sectors of the file if each physical sector of the data portion is defective, comprising steps of:

- reading the sector management portion and preparing therefrom a defect bit map representing whether each sector is defective by causing one sector to correspond to one bit, the defect bit map comprising information concerning the number of spread physical sectors and the number of management information recorded physical sectors; and
- preparing a defect index table representing the number of physical defects on a predetermined number of physical sectors.

10. A method according to claim 9, further comprising the steps of:

- determining that a logical sector corresponding to part of the sector management portion is defective when the part of the sector management cannot be read; and
- preparing a logical defect bit map representing the determination result of said determining step by causing one logical sector to correspond to one bit.

11. A method for preparing a defect bit map and a defect index table used for converting a logical address into a physical address, comprising the steps of:

- preparing a defect bit map storing defect information corresponding to each physical address of a recording medium if the physical address is defective;
- preparing, for every predetermined block of the defect bit map, a defect index table storing the number of defects within the block;
- storing the number of physical sectors managed by said defect bit map in said defect bit map as the number of spread physical sectors; and
- storing the number of physical sectors of sector management information which is recorded on the recording medium as a directory in said defect bit map as the number of management information recorded physical sectors.

* * * * *

UNITED STATES PATENT AND TRADEMARK OFFICE
CERTIFICATE OF CORRECTION

PATENT NO. : 5,526,335     Page 1 of 4
DATED : June 11, 1996
INVENTOR(S) : MASAHIRO TAMEGAI It is certified that error appears in the above-indentified patent and that said Letters Patent is hereby corrected as shown below:

ON THE COVER PAGE

[56]  References Cited

OTHER PUBLICATIONS

"62-259,567." should read --62-259567.--, and "1-081,028." should read --1-081028.--.

SHEET 3 OF THE DRAWINGS:

Figure 4B, "SISTEM" should read --SYSTEM--.

SHEET 10 OF THE DRAWINGS:

Figure 11, "SPREADED" (both occurrences) should read --SPREAD--.

SHEET 12 OF THE DRAWINGS:

Figure 15, "SPREADED" (both occurrences) should read --SPREAD--.

SHEET 13 OF THE DRAWINGS:

Figure 16, "SPREADED" should read --SPREAD--.

SHEET 16 OF THE DRAWINGS:

Figure 19A, "PHYGICAL" should read --PHYSICAL--.
Figure 19B, "PHYGICAL" should read --PHYSICAL--.

UNITED STATES PATENT AND TRADEMARK OFFICE
CERTIFICATE OF CORRECTION

PATENT NO. : 5,526,335  Page 2 of 4
DATED : June 11, 1996
INVENTOR(S) : MASAHIRO TAMEGAI It is certified that error appears in the above-indentified patent and that said Letters Patent is hereby corrected as shown below:

SHEET 17 OF THE DRAWINGS:

Figure 20A, "MANEGED" (both occurrences) should read --MANAGED--, and "PHYGICAL" should read --PHYSICAL--.

Figure 20B, "MANEGED" (both occurrences) should read --MANAGED--, and "PHYGICAL" should read --PHYSICAL--.

SHEET 18 OF THE DRAWINGS:

Figure 21, "PHYGICAL" should read --PHYSICAL--.

SHEET 19 OF THE DRAWINGS:

Figure 22, "SPREADED" (both occurrences) should read --SPREAD--.

SHEET 21 OF THE DRAWINGS:

Figure 24A, "SPREADED" (both occurrences) should read --SPREAD--.

SHEET 23 OF THE DRAWINGS:

Figure 26A, "SPREADED" (both occurrences) should read --SPREAD--.

SHEET 25 OF THE DRAWINGS:

Figure 28A, "SPREADED" (both occurrences) should read --SPREAD--.

UNITED STATES PATENT AND TRADEMARK OFFICE
CERTIFICATE OF CORRECTION

PATENT NO. : 5,526,335        Page 3 of 4
DATED : June 11, 1996
INVENTOR(S) : MASAHIRO TAMEGAI It is certified that error appears in the above-indentified patent and that said Letters Patent is hereby corrected as shown below:

SHEET 27 OF THE DRAWINGS:

Figure 30, "SPREADED" should read --SPREAD--.

COLUMN 2:

Line 10, "AF AT." should read --AF and AT.--.
Line 13, "sends" should read --sends the--.

COLUMN 5:

Line 8, "umber" should read --number--.

COLUMN 6:

Line 29, "showing a" should read --showing an--.

COLUMN 10:

Line 47, "is" should read --are--.

COLUMN 12:

Line 3, "spreaded" should read --spread--.
Line 4, "spreaded" should read --spread--.
Line 8, "respectively" should read --respectively.--.

COLUMN 17:

Line 1, "region" should read --region is--.
Line 59, " "3"0 " should read --"3"--.

UNITED STATES PATENT AND TRADEMARK OFFICE
CERTIFICATE OF CORRECTION

PATENT NO. : 5,526,335
DATED : June 11, 1996
INVENTOR(S) : MASAHIRO TAMEGAI

It is certified that error appears in the above-indentified patent and that said Letters Patent is hereby corrected as shown below:

COLUMN 20:

Line 1, "the" should read --preparing a physical defect bit map storing defect information corresponding to each physical address of the--.
Line 18, "method" should read --method according--.
Line 21, "Tbxn Tixm" should read --Tb x n = Ti x m--.
Line 39, "effects" should read --defects--.
Line 53, "in to" should read into--.
Line 61, "logical" should read -physical--.

COLUMN 21:

Line 6, "steps" should read --the steps--.
Line 15, "on" should read --in--.

Signed and Sealed this

Twenty-fifth Day of February, 1997

Attest:

BRUCE LEHMAN

*Attesting Officer*    *Commissioner of Patents and Trademarks*